United States Patent [19]

Misue et al.

[11] Patent Number: 5,764,239
[45] Date of Patent: Jun. 9, 1998

[54] AUTOMATIC GRAPH LAYOUT APPARATUS AND METHODS DETERMINING AND USING A STABLE STATE OF A PHYSICAL MODEL

[75] Inventors: Kazuo Misue; Kozo Sugiyama, both of Kawasaki, Japan

[73] Assignee: Fujitsu Limited, Kawasaki, Japan

[21] Appl. No.: 498,919

[22] Filed: Jul. 6, 1995

[30] Foreign Application Priority Data

Jul. 13, 1994 [JP] Japan .................. 6-160819

[51] Int. Cl.$^6$ .................................................. G06F 15/00
[52] U.S. Cl. .................. 345/440; 345/441; 345/442
[58] Field of Search .................. 395/140, 141, 395/142; 345/440, 441, 442

[56] References Cited

U.S. PATENT DOCUMENTS

| | | | |
|---|---|---|---|
| 5,257,346 | 10/1993 | Hanson | 395/125 |
| 5,404,426 | 4/1995 | Usami et al. | 395/120 |
| 5,450,535 | 9/1995 | North | 395/140 |
| 5,568,636 | 10/1996 | Koford | 395/488 |
| 5,596,703 | 1/1997 | Eick et al. | 395/326 |

OTHER PUBLICATIONS

Sugiyama et al., "Visualization of Structural Information: Automatic Drawing of Compound Digraphs," IEEE Transactions on Systems, Man, and Cybernetics, vol. 21, No. 4, Jul./Aug. 1991, pp. 876-892.

Eades et al., "How to Draw a Directed Graph," Visual Languages, IEEE Workship, Jan., 1989, pp. 13-17.

Eades, P., "A heuristic for graph drawing," Congressus Numerantium, vol. 42, 1984, pp. 149-160, Jan.

Anijo et al., "A Simple Method for Extracting the Natural Beauty of Hair," Computer Graphics, 26, 2, Jul. 1992, pp. 111-120.

*Primary Examiner*—Phu K. Nguyen
*Assistant Examiner*—Jennifer C. Chen
*Attorney, Agent, or Firm*—Staas & Halsey

[57] ABSTRACT

A method of automatically laying out a graph having a plurality of nodes and edges, each indicating a relationship between the nodes, capable of laying out a plurality of kinds of edge in accordance with their respective different rules. It is arranged so that forces acting on each edge are defined to control the direction of the edge, a physical model is prepared corresponding to the graph into which the forces are incorporated, a stable state of the physical model is obtained, and the graph is drawn or displayed corresponding to the stable state of the physical model.

33 Claims, 32 Drawing Sheets

RELATIONSHIP OF A MAGNETIC NEEDLE TO THE DIRECTION OF AN EDGE

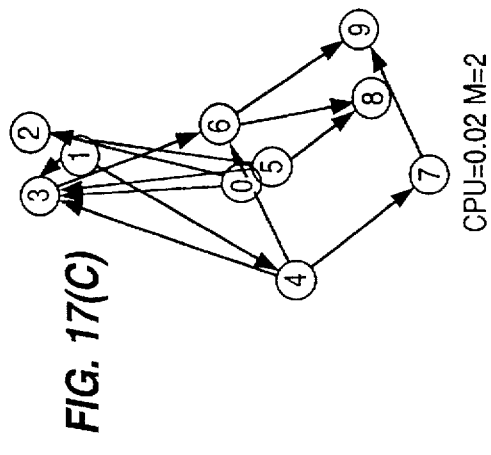
FIG. 17(C) CPU=0.02 M=2
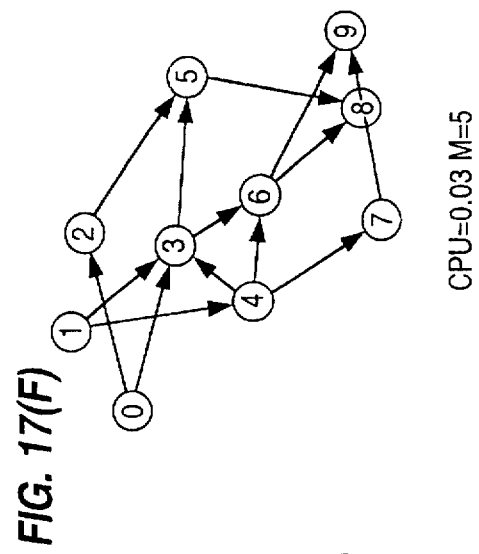
FIG. 17(F) CPU=0.03 M=5
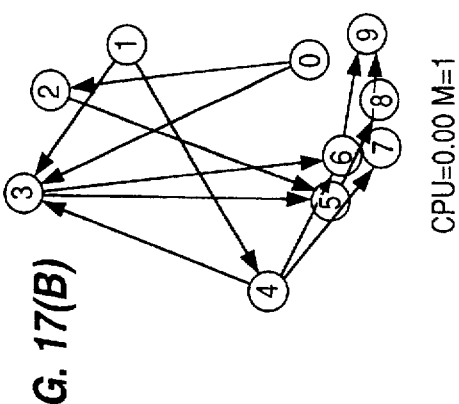
FIG. 17(B) CPU=0.00 M=1
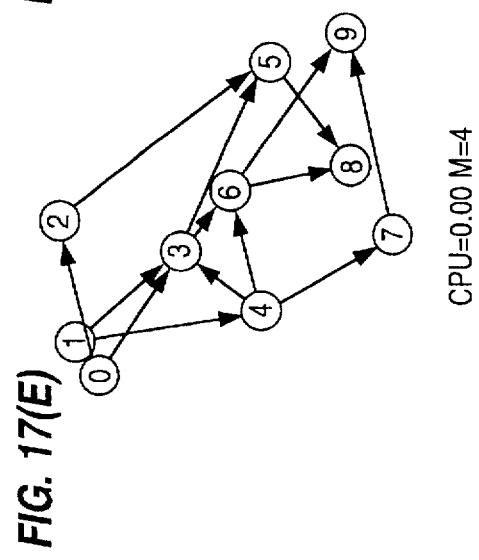
FIG. 17(E) CPU=0.00 M=4
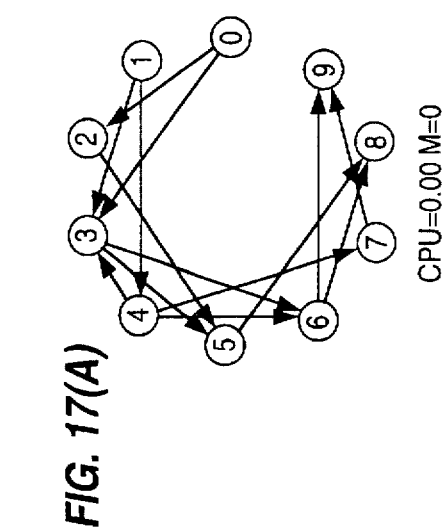
FIG. 17(A) CPU=0.00 M=0
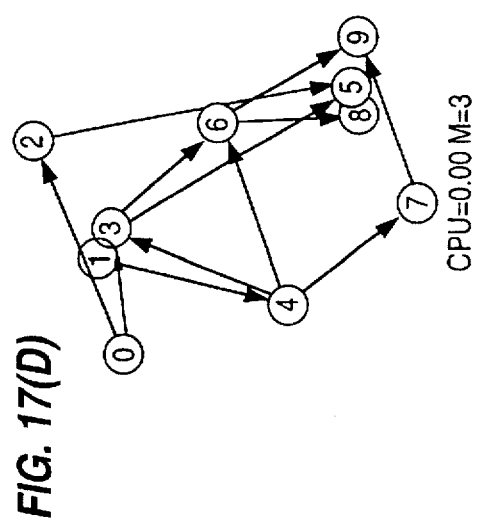
FIG. 17(D) CPU=0.00 M=3

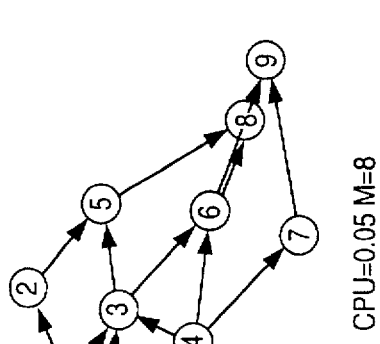
FIG. 18(A)
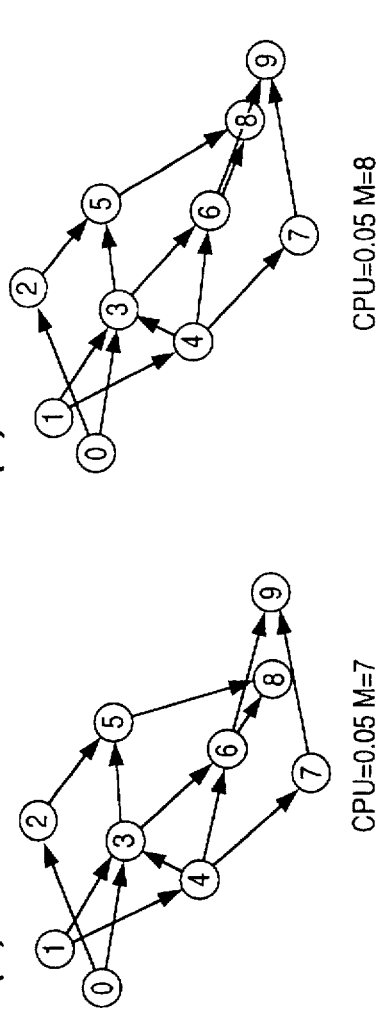
FIG. 18(B)
FIG. 18(C)
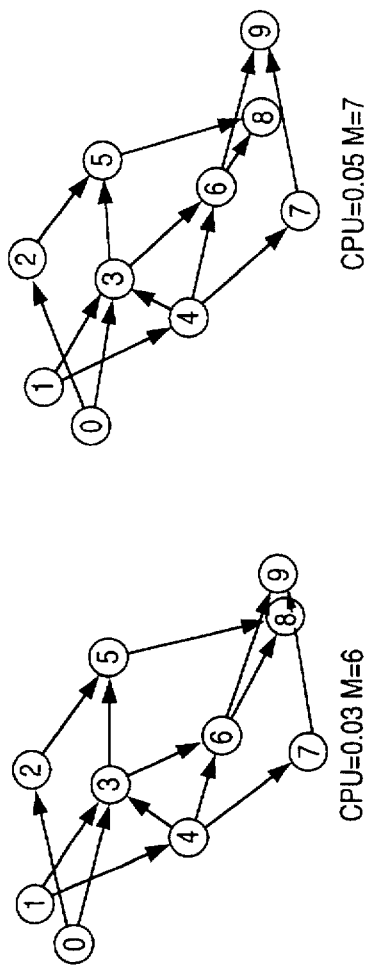
FIG. 18(D)
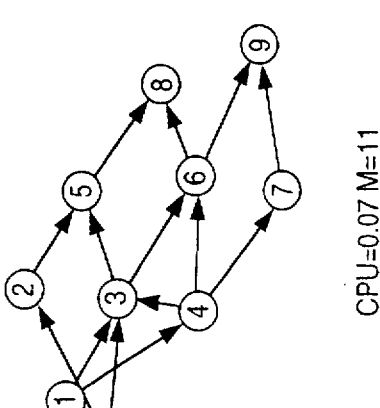
FIG. 18(E)
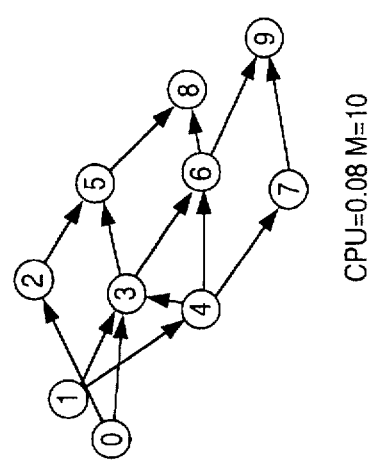
FIG. 18(F)
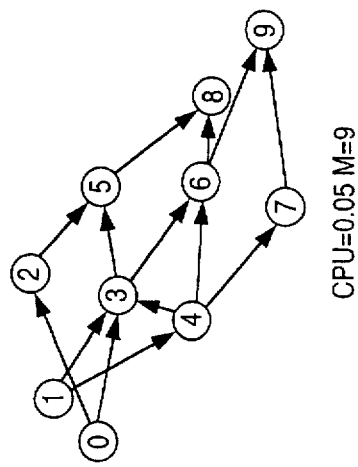

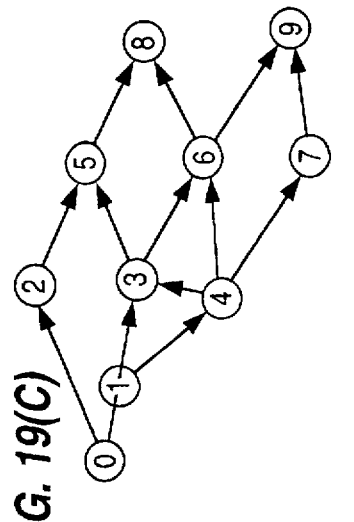
FIG. 19(C) CPU=0.08 M=14
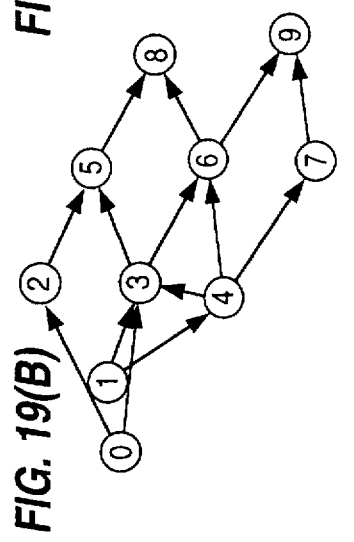
FIG. 19(B) CPU=0.08 M=13
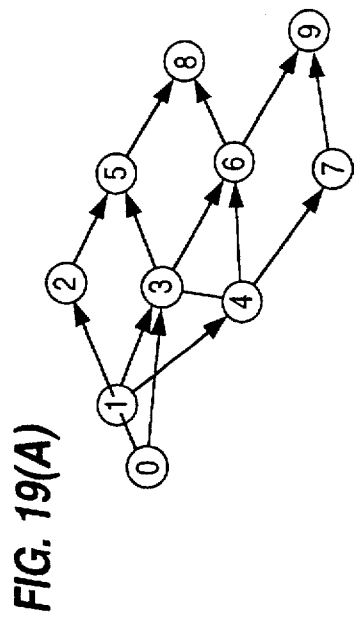
FIG. 19(A) CPU=0.07 M=12
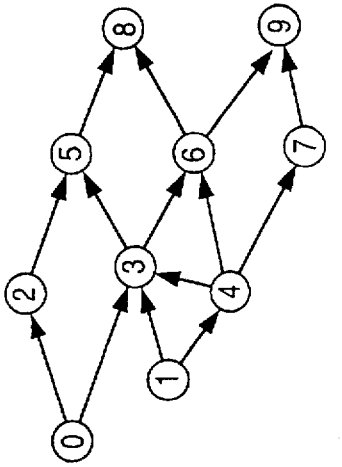
FIG. 19(F) CPU=0.10 M=17
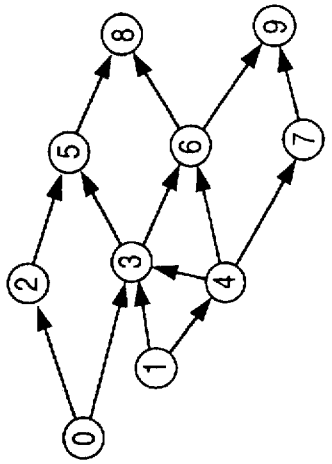
FIG. 19(E) CPU=0.10 M=16
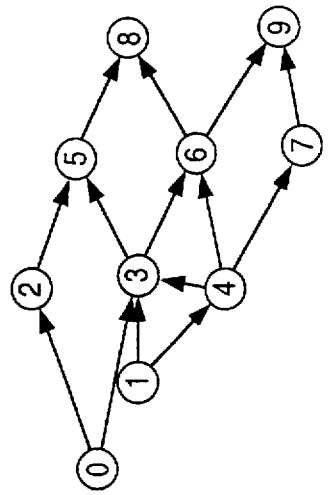
FIG. 19(D) CPU=0.03 M=15

CPU=0.62 M=100
CMF=0.00

CPU=0.00
M=1 CMF=1.00

CPU=0.00
M=2 CMF=1.00

CPU=0.02
M=3 CMF=1.00

CPU=0.02
M=4 CMF=1.00

CPU=0.02
M=5 CMF=1.00

CPU=0.05 M=8

CPU=0.07 M=11

CPU=0.03 M=7

CPU=0.07 M=10

CPU=0.05 M=6

CPU=0.07 M=9

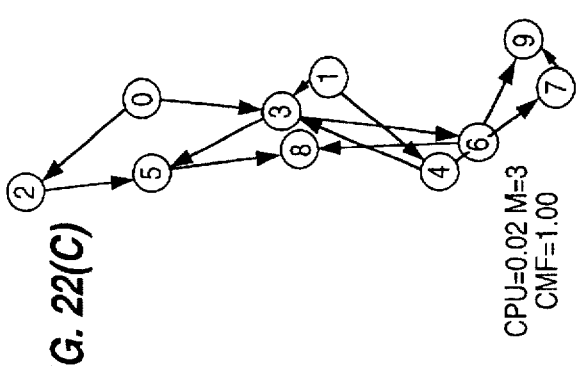
FIG. 22(C)
CPU=0.02 M=3
CMF=1.00
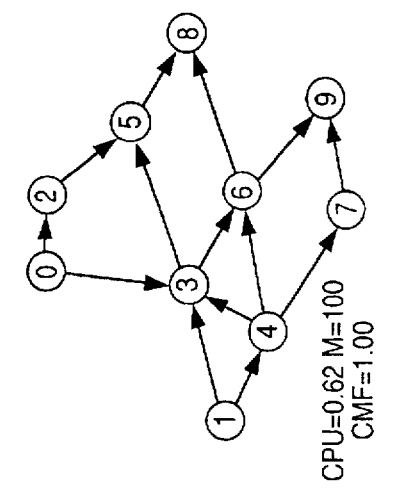
FIG. 22(F)
CPU=0.62 M=100
CMF=1.00
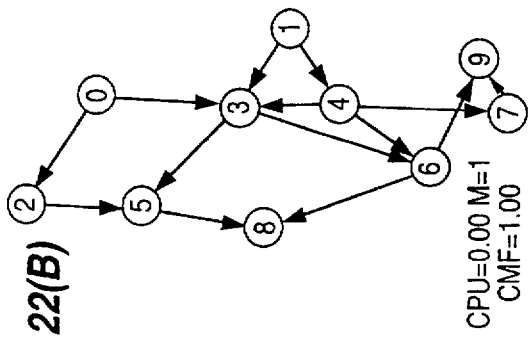
FIG. 22(B)
CPU=0.00 M=1
CMF=1.00
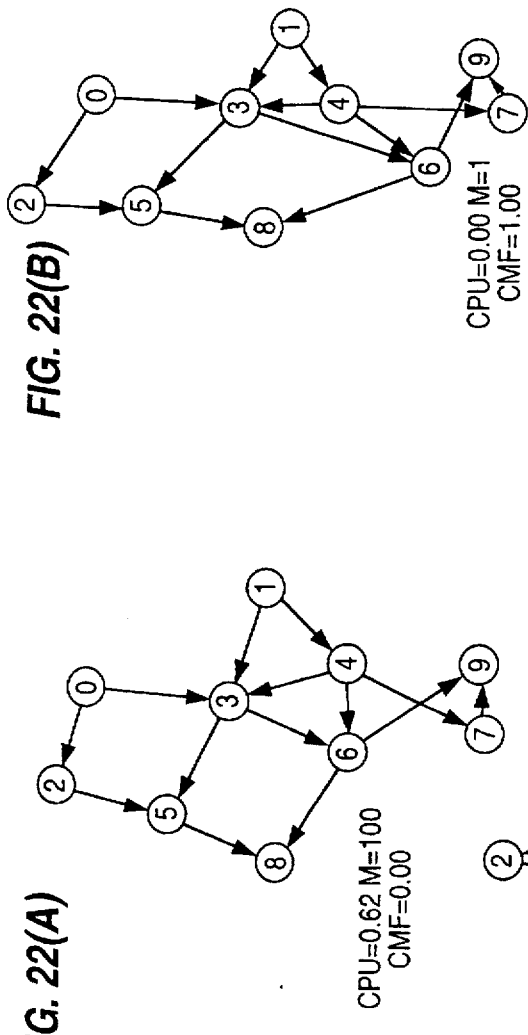
FIG. 22(E)
CPU=0.18 M=30
CMF=1.00
FIG. 22(A)
CPU=0.62 M=100
CMF=0.00
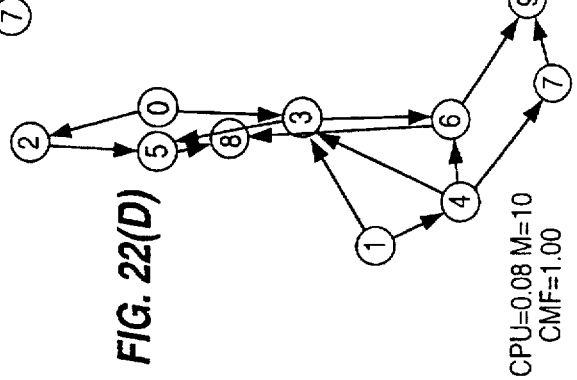
FIG. 22(D)
CPU=0.08 M=10
CMF=1.00

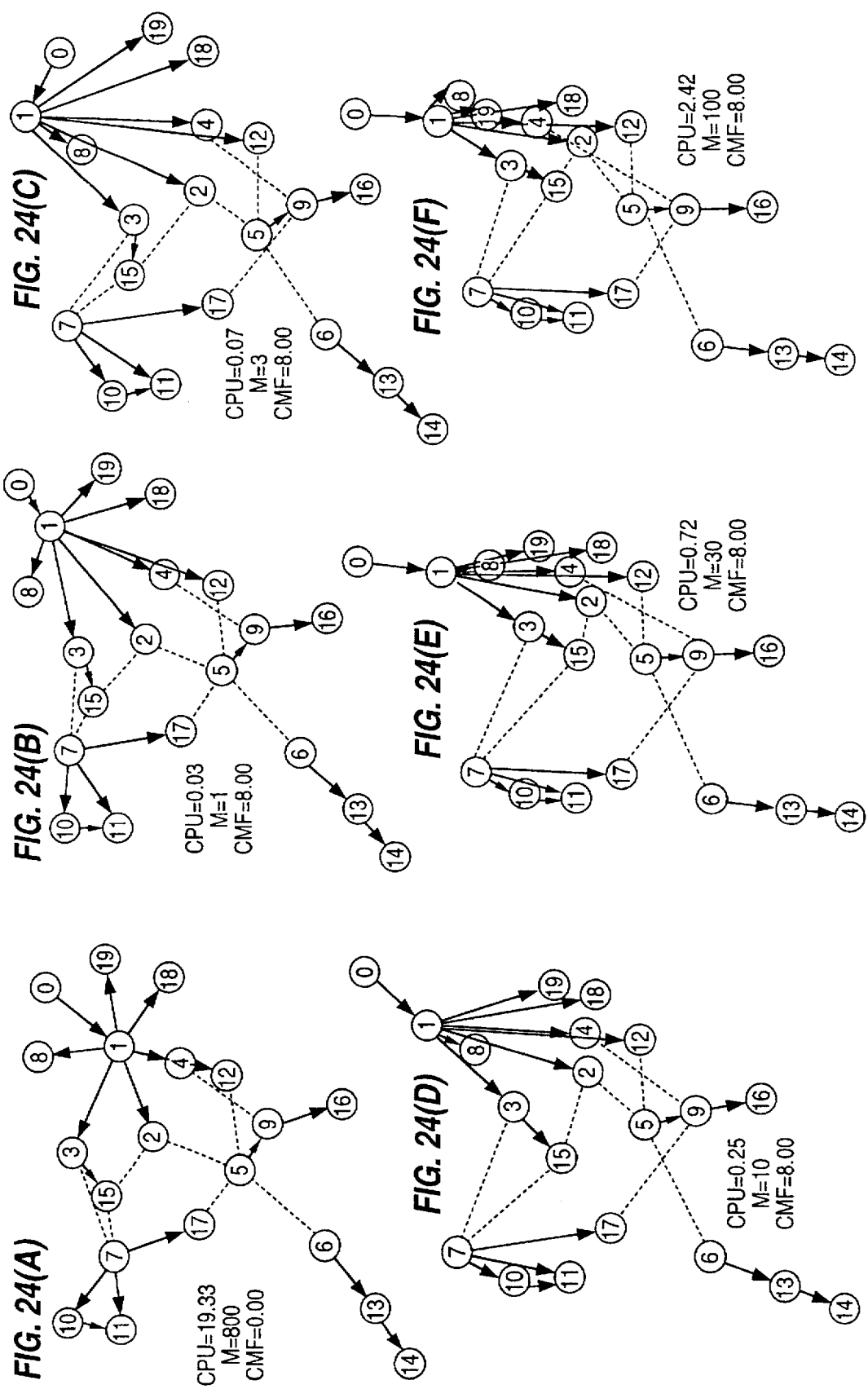

AUTOMATIC GRAPH LAYOUT APPARATUS AND METHODS DETERMINING AND USING A STABLE STATE OF A PHYSICAL MODEL

BACKGROUND OF THE INVENTION

1. Field of the Invention

The present invention relates to a method of automatically laying out graphs which are used to show various structures in various fields including computer science and, more particularly, an automatic graph layout method of drawing or displaying a graph while automatically determining the position of each node in the graph, which consists of a collection of nodes, and a collection of edges each showing a relationship between the nodes.

2. Description of the Related Art

Graphs are used in various fields including information science and engineering to show various structures (such as networks, process flows and constitutional structures). Mathematically (or from the viewpoint of graphical theory) speaking, the graph has a topological structure consisting of nodes and edges, and it is troublesome for a person to draw the structure clearly so that it can be easily understood. Therefore, there is a desire to use a computer to draw such graphs. The method of drawing a graph depends upon the application (or the things the graph intends to practically show or express, such as networks and constitutional structures), and the standards by which it is judged whether or not the graph is easy to understand will change, depending upon application. Even when all relationships can be mathematically expressed by edges of one kind, for example, various kinds of relationship (or edges) are included in each application, it is sometimes desirable to change the manner of representing each kind of edge.

A large number of automatic graph layout methods have been proposed. Some typical methods are as follows.

One of the most often used of the automatic layout methods which are intended for arrow graphs (whose edges have a direction) is called the "Sugiyama algorithm", or variations of the same principle. Nodes are arranged on parallel lines, with their arrow edges in the same direction (downward, for example). The Sugiyama algorithm is characterized in that "flow" of the whole, as expressed by the arrow edges, is easy to understand. It is detailed in a reference "Sugiyama K and et al., IEEE Trans., SMC Vol. 11, No. 2, pp. 109–125 (1981)"

One of the most often used of the automatic layout methods which are intended for non-arrow graphs (whose edges have no direction) is called the "spring algorithm", or more commonly the "force directive method". The graph is expressed as a virtual physical model, attraction and repulsion acting between the nodes are defined, and a stable state of the model is searched for, thereby determining an appropriate layout (for example, each node is regarded as a ring having a mass of 0 and a magnitude of 0, each edge is regarded as a spring between these connecting rings, and a state under which the energy of all springs becomes a minimum is found). This method is characterized in that the graph has a symmetry which is easy to understand. A reference "Eades P., Congressus Numerantium, Vol. 42, pp. 149–160 (1984)" is typical of the spring algorithm.

FIG. 1 shows the layout of a graph derived by the conventional force directive method. Forces acting between the nodes are expressed as springs. It is assumed that virtual repulsion acts between two nodes not connected by a spring. This repulsion is a virtual force having nothing to do with the spring forces acting between the other nodes.

In a graph, arrow and non-arrow edges are sometimes both present, and there are many different kinds of non-arrow edges. FIG. 2 shows an example of a problem chart in which a plurality of problems have mutual relationships between them. In FIG. 2, four kinds of relationships are possible between problems, that is, problems related to each other, problems depending upon each other, common and specific problems, and problems opposed to each other. The relationship from a common to a specific problem is an arrow relationship expressed by a directed arrow, and the remaining three kinds of relationships are non-arrow ones. When this problem chart is to be drawn as a mixed graph in which arrow and non-arrow edges are present, it is quite natural to discriminate arrow edges from non-arrow edges, and it is also desirable when laying the graph out, to change the graph drawing manner for each relationship between non-arrow edges.

The conventional graph layout methods were intended not to limit the directions of edges to be on a plane, or to direct edges in the same direction, as described above. The former was often seen in laying out non-arrow graphs, while the latter was often seen in laying out arrow graphs.

When a two-branched tree is used as a target, for example, there is a method of directing edges to be extended right for right sub-nodes, and to be extended downward for left sub-nodes, e.g. in different directions, but this is for the specific case where the type of target is limited. Frankly speaking, there has not yet been provided a method of laying out edges to follow rules for a plurality of kinds of edges, in such a way that edges of the same kind are directed in the same direction, and that edges of other kinds are free to be in any direction.

In FIG. 2, for example, specific problems are arranged under common problems, and problems having an equivalent relationship are arranged side by side in the horizontal direction. A method of laying out a graph in this manner has not yet been provided.

FIG. 2 corresponds to FIG. 7 in a reference "M. J. Bickerton, A Practitioner's Handbook of Requirements Engineering Methods and Tools, Oxford Univ., 1992".

SUMMARY OF THE INVENTION

The objects of the present invention are to lay out arrow and non-arrow edges of a mixed type of graph, for example, in accordance with different rules, to lay out a plurality of kinds of edges in an arrow or non-arrow graph, in accordance with their respective different rules, and to find a stable state of the physical model wherein the edges are represented by magnetic springs having the properties of azimuth magnetic needles, for example.

Forces acting on edges are defined to control the direction of each edge, these defined forces are incorporated, and a physical model corresponding to a graph which is obtained as a result of expressing the edges as magnetic springs having the properties of azimuth magnetic needles and springs, for example, placed in virtual magnetic field, is realized.

When edges are expressed by magnetic springs, for example, the force acting on the edges is a rotational force created by the magnetic field, and a physical model in which this rotation and attraction or repulsion is created by the action of springs, is prepared.

A stable state of the physical model is found by progressively repeating the correction of position of each node in the physical model, and a graph is then drawn or displayed, corresponding to this stable state of the physical model.

According to the above-described force directive method, a physical model was prepared by defining attraction and repulsion acting between the nodes, and when a stable state of the model was found, the layout of a graph was determined. In contrast, the present invention is particularly characterized in that the forces acting on edges of a graph are defined upon preparing a physical model. When forces for a particularly rotation acting on edges are defined, as described above, the direction of each edge can be controlled, which is difficult using the conventional force directive method in which only forces acting between nodes were defined.

According to the present invention, a stable state of the physical model is found, wherein the edges are azimuth magnetic needles and that the graph which consists of edges and nodes is placed in a virtual magnetic field. Rotational force acts on the edges, which are expressed by azimuth magnetic needles, to attract them to the pole N of the magnetic field. Practically, a model which utilizes not only the forces acting on the edges, but also those acting between the nodes, is used because the layout of a graph can be more efficiently conducted by also controlling the interval between nodes. The physical model is prepared, wherein the edges are magnetic springs having the properties of azimuth magnetic needles, and a stable state of the model is found when it is placed in a magnetic field.

The magnetic fields used in the present invention are virtual, to cause forces to act on the edges of a physical model, and they do not necessarily have the same properties as those of physical magnetic fields. For example, magnetic fields of two or more kinds which may influence each other by addition or subtraction of forces, can be generated simultaneously to find a stable state of the physical model. When it is arranged that the azimuth magnetic needles which represent the edges receive forces from only specific magnetic fields from a plurality of kinds of magnetic fields, the direction of each edge can be controlled according to a different rule for each edge.

BRIEF DESCRIPTION OF THE DRAWINGS

FIGS. 17(A)–(F) are diagrams (1) showing processing starting from the initial arrangement and ending with a layout result shown in FIG. 16B;

FIGS. 18(A)–(F) are diagrams (2) showing processing starting from the initial arrangement and ending with the layout result shown in FIG. 16B;

FIGS. 19(A)–(F) are diagram (3) showing processing starting from the initial arrangement and ending with the layout result shown in FIG. 16B;

FIGS. 22(A)–(F) are explanatory diagrams showing processing starting from the result shown in FIG. 16A and ending with the result shown in FIG. 16B, in a case where some of nodes are fixed as anchors;

FIGS. 24(A)–(F) are explanatory diagrams showing processing starting from a result shown in FIG. 23A and ending with a result shown in FIG. 23B;

DETAILED DESCRIPTION OF THE PREFERRED EMBODIMENTS

Figure 4B:
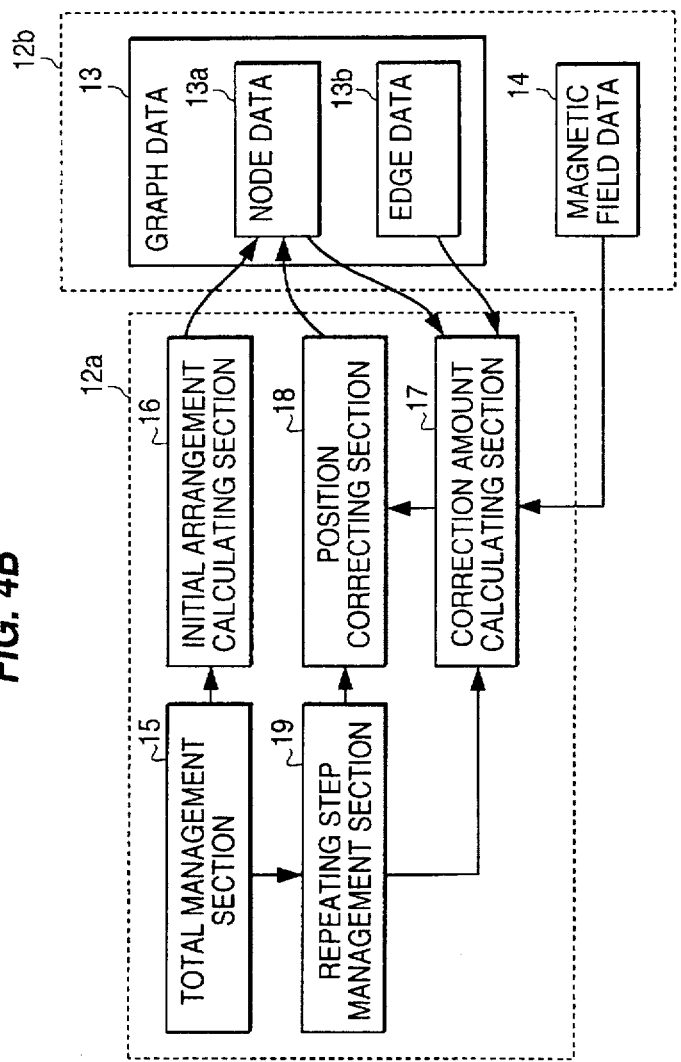
FIGS. 4A and 4B are block diagrams showing an arrangement of a computer system to realize an automatic graph layout method of the present invention.
Figure 4A:
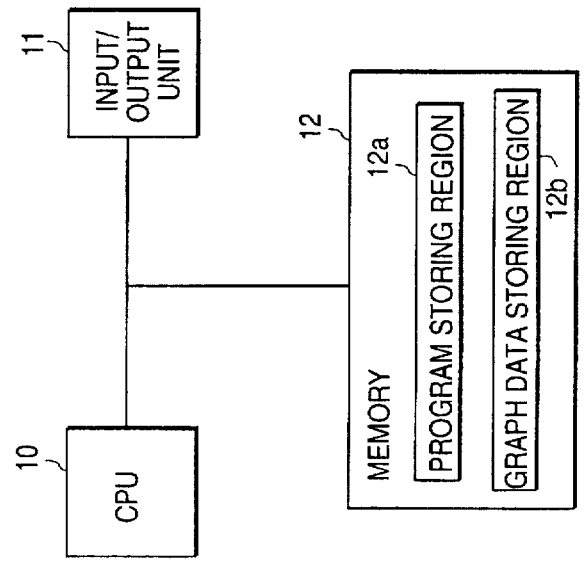

FIGS. 4A and 4B are block diagrams showing the configuration of a computer system used to realize the automatic graph layout method according to an embodiment of the present invention. As shown in FIG. 4A, the computer system is common, comprising a central processing unit (CPU) 10, an input/output unit 11, and a memory 12. The memory 12 includes a region 12a for storing programs to achieve the automatic graph layout method, and another region 12b for storing data to achieve the automatic graph layout method.

FIG. 4B shows the program and graph data storing regions 12a and 12b in more detail. Data in the graph data storing region 12b consists of graph data 13 and data 14 representing a magnetic field, gravity, electric field, and the like of a physical model. Node data 13a include x, y co-ordinates data of each node and data of the edge combined with the node, that is, node attribute data such as form, size, color, and the kinds of line of the node. Edge data 13b include edge attribute data such as form, starting and ending points, kinds and width of line and color of each edge, and data for designating which of a magnetic field, gravity, and electric field influence the edge, in addition to ideal standard length data of the edge to calculate the force strength of a spring which serves as magnetic spring and nodes combined with the edge. These graph data are inputted through the input/output unit 11 by the user, for example, and the layout result of a graph is displayed on a display screen of the input/output unit 11.

The program storing region 12a includes a total management section 15 for managing the whole of an automatic graph layout, a calculation section 16 for calculating the initial arrangement of each node, another calculation section 17 for calculating the amount of positional correction of the node using node and edge data 13a and 13b and data 14, a position correcting section 18 for correcting the position of the node in response to the output of the correction amount calculating section 17, and a repeat management section 19 for managing the number of times for which the node position set is corrected while being controlled by the total management section 15.

Figure 5:
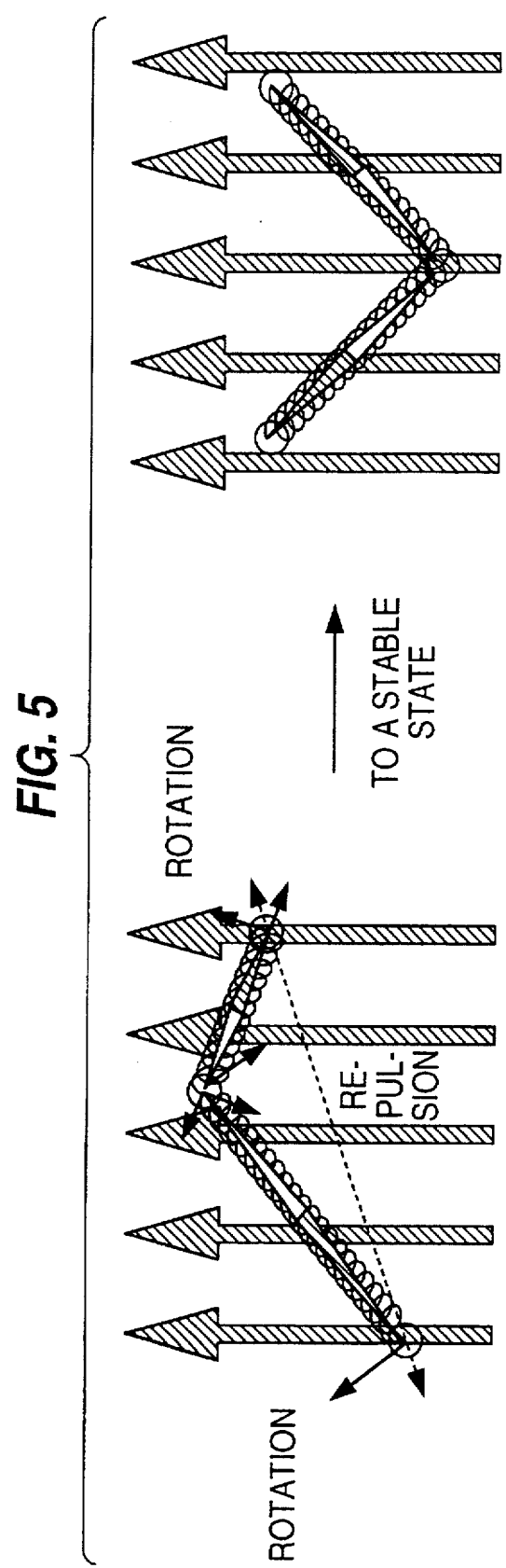
FIG. 5 shows how a graph is laid out using a physical model in which magnetic springs are used.

FIG. 5 is intended to explain a method of laying out the graph of a physical model while using magnetic springs. The stable state of the physical model is calculated, wherein the edges of the graph are represented by magnetic springs and the graph is placed in a virtual magnetic field. Forces acting on the physical model in this case are attraction or repulsion created by the springs, attraction or repulsion acting between nodes neither arranged side by side nor combined with each other by a spring, and a rotational force that the edge receives from the magnetic field. The repulsion which acts between nodes not arranged side by side is a virtual one, which is neither a force created by the spring nor a force received from the magnetic field.

The force acting on each node is obtained as a resultant of these forces, and the amount of positional correction of each node is calculated using the force thus obtained. The layout changes while repeating the step of correcting the position of the node little by little. This repetitive step is conducted until the resultant force added to each node becomes smaller than a predetermined threshold value, or repeated just for a predetermined number of times.

Figure 6:
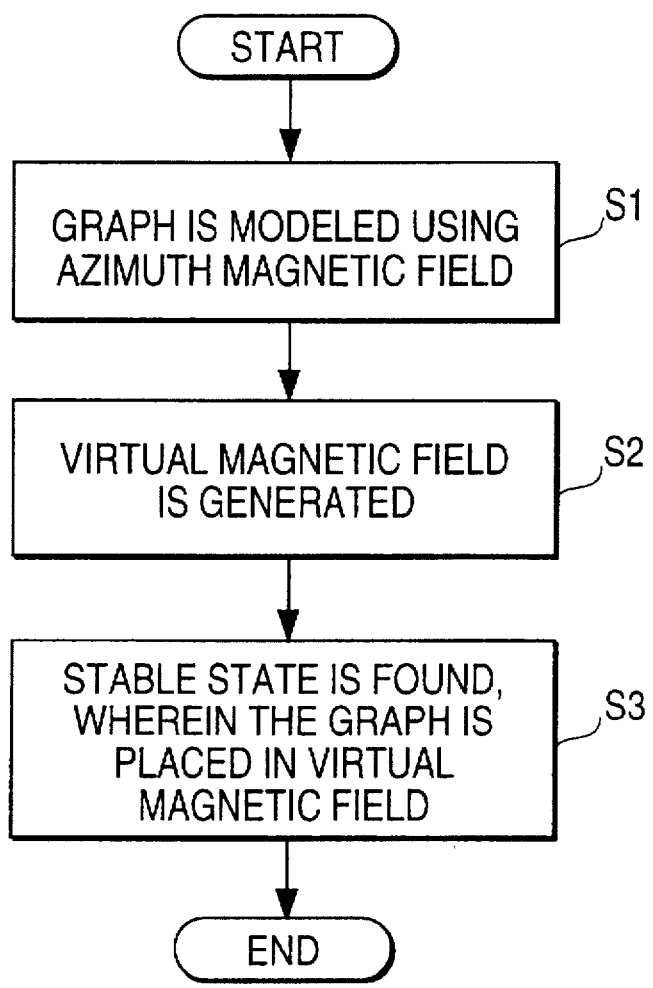
FIG. 6 is a flow chart showing a principle of the automatic graph layout method according to the present invention.

FIG. 6 is a flow chart showing all the principle steps of an automatic layout method according to the present invention. A graph is modeled at a step S1, using azimuth magnetic needles, a virtual magnetic field is prepared at a step S2, and the stable state of the graph is obtained at a step S3, wherein the graph is placed in the virtual magnetic field. The process including the steps S1 and S2 corresponds to the one of inputting graph data 13 and the like in FIG. 4B, and the actual process of automatically laying out the graph is conducted at the step S3.

Figure 7:
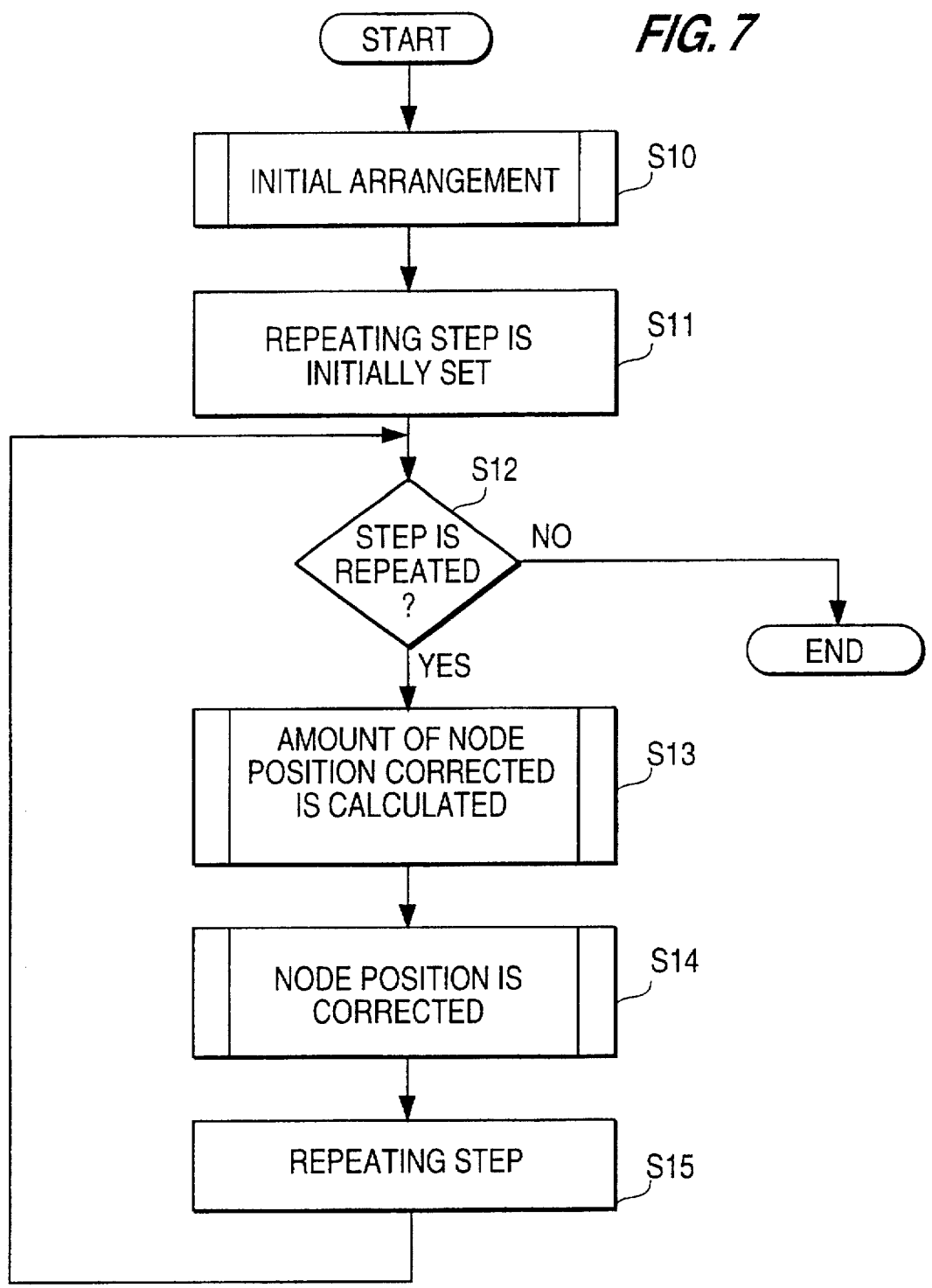
FIG. 7 is a general flow chart of all processing steps of the automatic graph layout method according to the present invention.

FIG. 7 is intended to explain how the automatic graph layout method according to the present invention usually progresses. When the process is started, an initial arrangement for each node is set at a step S10. An initial value at which the correction of node position is repeated until the process is finished, is set at a step S11, and the repeating step is started.

According to the predetermined threshold value or the number of times the process is repeated, it is then confirmed at a step S12 whether or not the correction of node position must be repeated. When it is to be repeated, the amount of node position corrected is calculated at a step S13. This amount of correction is calculated from the resultant force, including the force created by the springs, attraction or repulsion acting between nodes not arranged side by side, and rotational force caused by the magnetic field, and is added to the edge.

When the amount of correction is obtained, the node position is corrected at a step S14 and an increment is added to the number of times the process is repeated, for example, at a step S15. The step S12 and those following it are thus repeated. When it is decided at the step S12 that the repeating step must be stopped, the process is finished.

Figure 8:
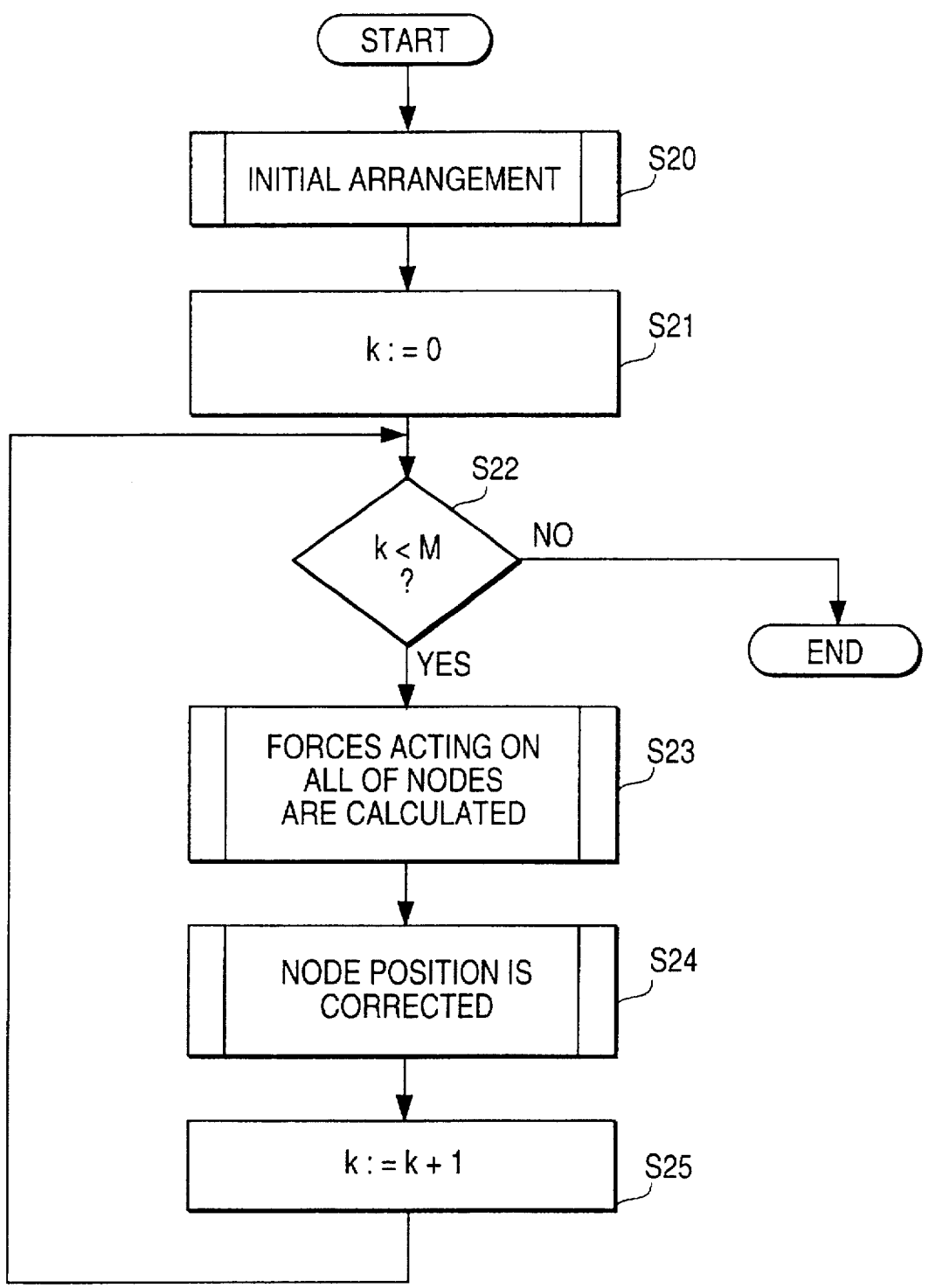
FIG. 8 is a flow chart showing all processing steps of the automatic graph layout method according to an embodiment of the present invention.

FIG. 8 is a flow chart showing all steps of the automatic graph layout method according to an embodiment of the present invention. When the process is started in FIG. 8, an initial arrangement of each node is determined at a step S20 and the value of k which represents the number of the repeated times is set to "0", as an initial set value, at a step 21. It is confirmed at a step S22 whether or not the value k is smaller than the maximum value M of the number of the repeated times.

When k is smaller than M, the force acting on each node is calculated at a step S23 to obtain the amount of positional correction relating to all nodes; the position of each node is corrected at a step S24; an increment is added to the value of k at a step S25; and the step S22 and those following it are then repeated. When it is found at the step S22 that k is not smaller than M, the process is finished.

Figure 9:
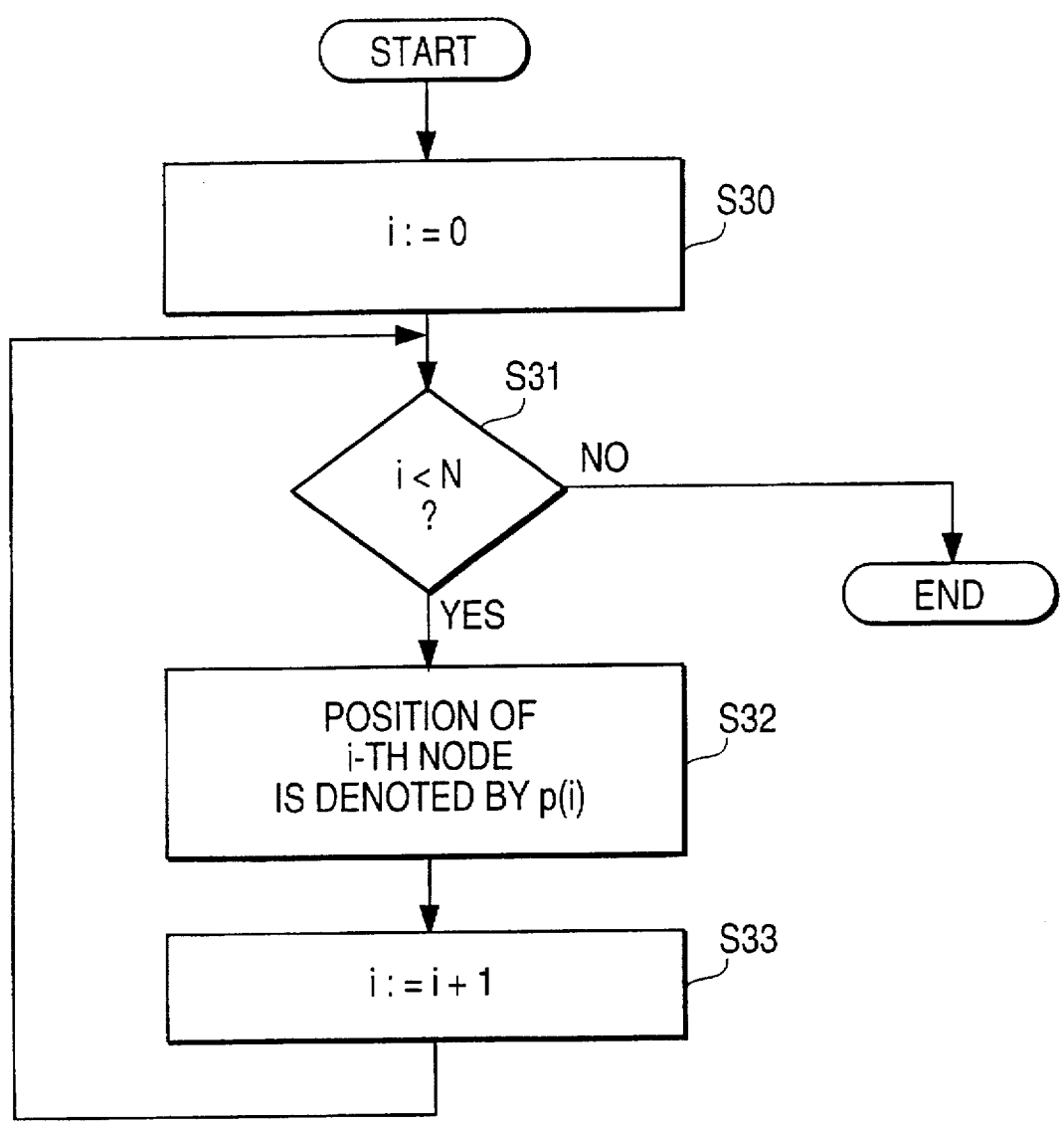
FIG. 9 is a flow chart showing an initial arrangement in more detail.

FIG. 9 is a flow chart showing the step S20 in FIG. 16 or the initial arrangement of each node in more detail. When the process is started in FIG. 9, i representing the ordinal number of nodes is set to "0" at a step S30 and it is confirmed at a step S31 whether or not the ordinal node number i is smaller than the cardinal number N of nodes.

When i is smaller than N, the position of the node is calculated from the following formula (1) at a step S32; an increment is added to the value of i at a step S33; and the step S31 and those following it are repeated. When it is found at the step S31 that the ordinal node number i is not smaller than N, the process is finished.

Figure 10:
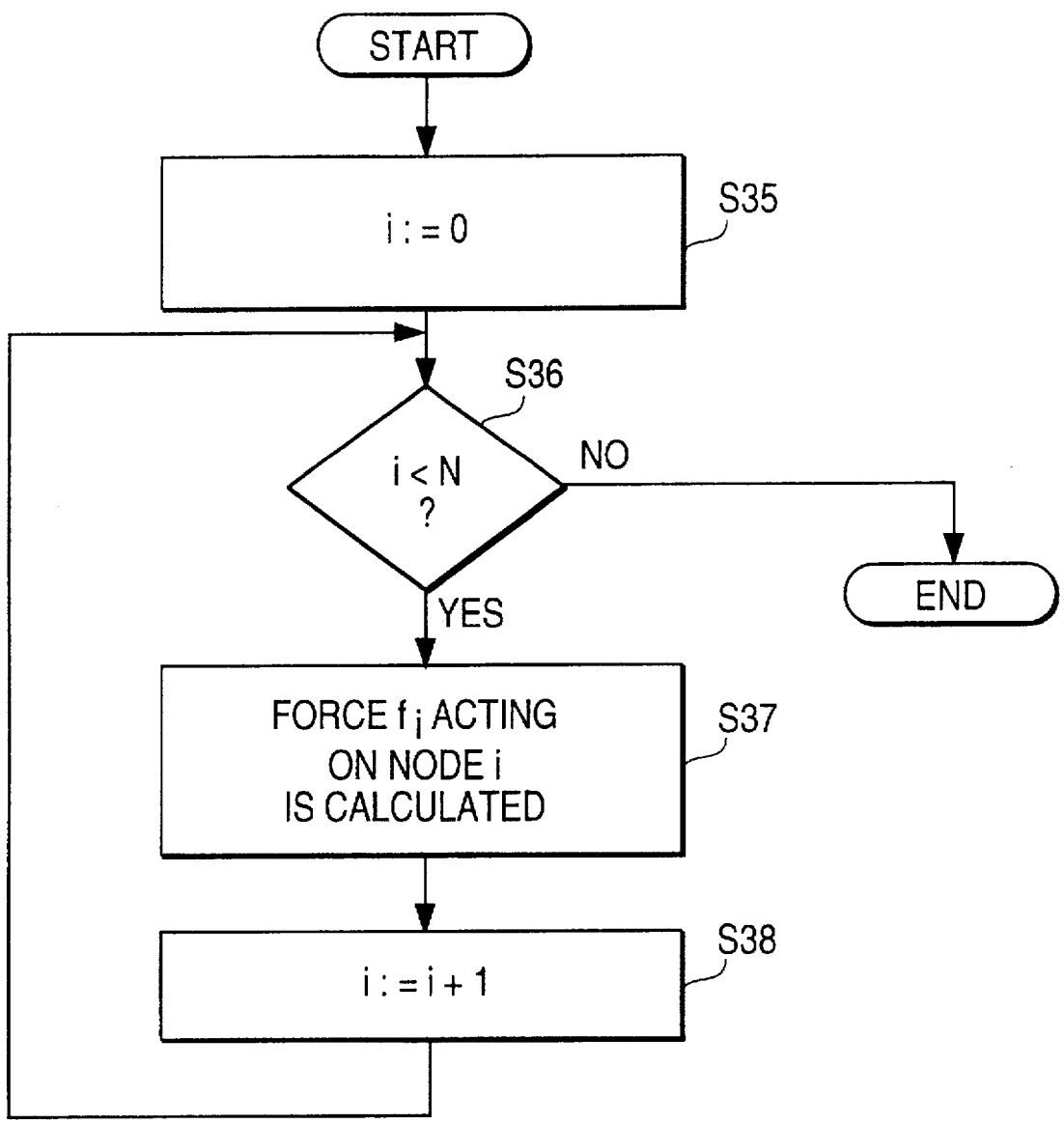
FIG. 10 is a detailed flow chart showing steps of calculating forces acting on all nodes.

FIG. 10 is a detailed flow chart showing the step S23 in FIG. 8 or the step of calculating the force which acts on all nodes. When the process is started in FIG. 10, i representing the ordinal number of nodes is set to "0" at a step 35, and it is confirmed at a step S36 whether or not i is smaller than N.

When i is smaller than N, force $f_i$ which acts on the node i, on which also the calculation of the amount of the node position corrected is based, is calculated at a step S37; an increment is added to the value of i at a step S38; and the step S36 and those following it are repeated. When it is found at the step S36 that i is not smaller than N, the process is finished.

Figure 11:
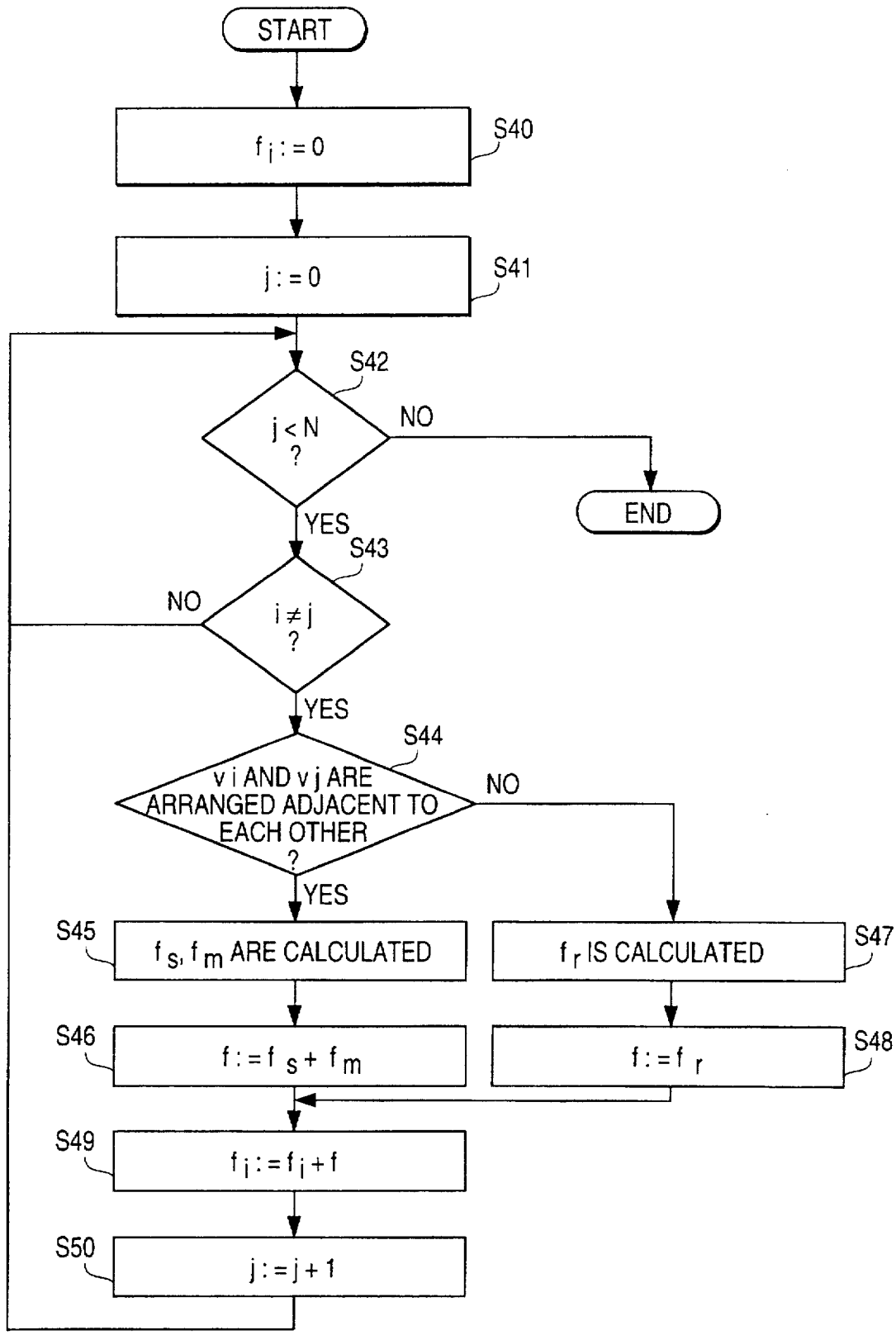
FIG. 11 is a detailed flow chart showing steps of calculating forces acting on a node.

FIG. 11 is a flow chart showing the step S37 in FIG. 16 or the calculation of the force acting on each node or in more detail. Before the process in FIG. 17 is described, the initial arrangement of each node and the force acting on it will be described in detail.

It is also important how the initial arrangement of each node is determined, because layout results obtained in this case by the method, in which the position of each node is changed little by little from the initial position of the node, are different. In order to obtain an effective initial arrangement, the method of arranging nodes on a circumference at a same interval is used, for example. In this method, the initial co-ordinates of i-th node $v_i$ are obtained by the following function p:

$$p(i) = \left( r \cdot \cos\left( i \cdot \frac{2\pi}{N} \right), r \cdot \sin\left( i \cdot \frac{2\pi}{N} \right) \right) \quad (1)$$

wherein radius r is selected so as to make the interval between nodes 1:

$$r = \frac{1 \cdot N}{2\pi} \quad (2)$$

It is assumed that three kinds of forces act on each node. They are the force created by a spring when an edge is regarded as the spring, attraction or repulsion acting between nodes not arranged side by side, and force or rotational force received from the magnetic field when the edge is regarded as a magnetic needle. And it is assumed that each node $v_i$ receives the resultant force $f_i$ of these forces.

All edges are regarded as springs, and nodes at both ends of the spring are attracted or repulsed by the spring. The force which the node at one end of the edge (or spring) receives from the spring is denoted by $f_s$, and its magnitude can be calculated as follows (a force created by the spring usually follows Hook's law, but in this case it does not follow Hook's law but is virtual).

$$|f_s| = c_s \cdot \log \frac{d}{d_o} \quad (3)$$

wherein d denotes the length of a currently-used spring, $d_o$ denotes the natural length of the spring (or ideal length of the edge) and $c_s$ denotes a constant set to control the balance with other forces. The force is in a direction in which the node at the other end of the spring is viewed. Attraction and repulsion are reverse in their directions, but in the case of repulsion, the magnitude of the above-mentioned equation (3) becomes negative. Its direction may be therefore regarded as being the same as attraction.

It is assumed that repulsion acts between nodes not arranged side by side. The repulsion which a node receives from another node not arranged side by side with the former is denoted by $f_r$. Its magnitude can be calculated as follows: The following equation (4) is obtained by replacing "2" in the formula of repulsion for the above-mentioned reference (Eades, P) by $P_r$.

$$|f_r| = \frac{c_r}{d^{p_r}} \quad (4)$$

wherein d represents the distance currently-present between nodes, $P_r$ represents a constant which can be optionally set to control the influence added to the magnitude of repulsion by the distance (in short, the larger $P_r$ is made, the more rapid the increase of repulsion becomes as the nodes come nearer to each other), and $c_r$ represents a constant set to control the balance with other forces. The direction of the repulsion force acting between nodes not arranged side by side is in reverse to the direction of those nodes which receive the attraction force from each other.

Figure 12B:
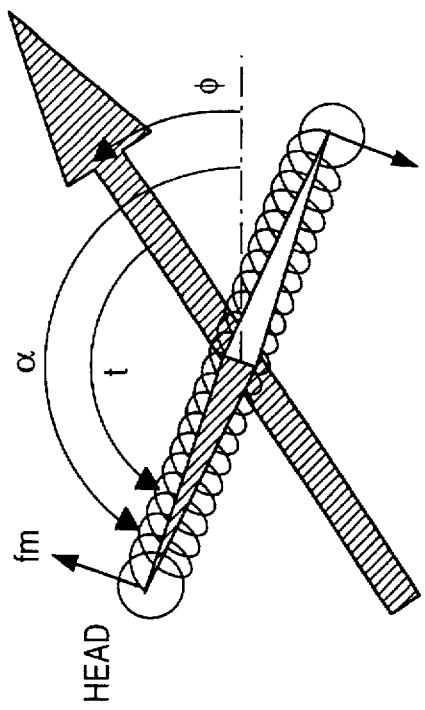
FIGS. 12A, 12B and 12C are explanatory diagrams to explain equations (6) and (7)
Figure 12A:
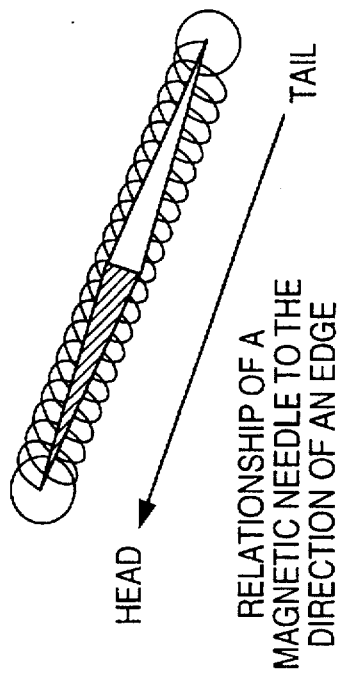
Figure 12C:
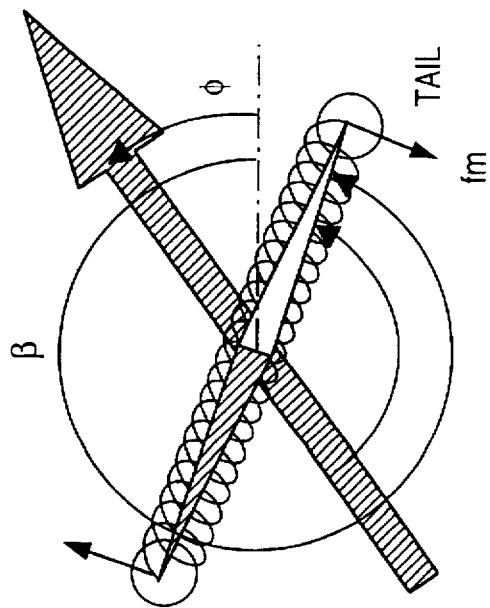

As shown in FIG. 12A, some or all of the edges are regarded as magnetic needles, which receive rotation or rotational force from the virtual magnetic field in which the graph is placed. In the case of an arrow or directed edge, it is rotated in such a way that its head is directed to the pole N and that its tail is directed to the pole S. It is assumed that the force the node at one end of the edge (or magnetic needle) receives as the rotating force for the magnetic needle is denoted by a variable $f_m$, and that the magnitude of this variable $f_m$ can be virtually calculated as follows.

$$|f_m| = \begin{cases} c_m \cdot b \cdot d^{q_m} \cdot t^{p_m} & t \geq 0 \\ -c_m \cdot b \cdot d^{q_m} \cdot (-t)^{p_m} & t < 0 \end{cases} \quad (5)$$

wherein t represents an angle by which the head (or tail) is shifted from the direction of the pole N (or S) of magnetic field at a reference point (at which the direction of the magnetic field relative to the magnetic needle is checked; the reference point is needed because it is not guaranteed that the direction of the magnetic field is the same at any point along the edge; at the middle point of the edge, for example). In short, provided that the direction of the magnetic field is denoted by $\phi$ (unit: radians), and that the direction in which the head is viewed from the side of the tail is represented by $\alpha$, in a case where the node that receives a force is a head, as shown in FIG. 12B, t is represented by the following equation.

$$t = \alpha - \phi \pm 2 n\pi \quad (6)$$

Figure 16A:
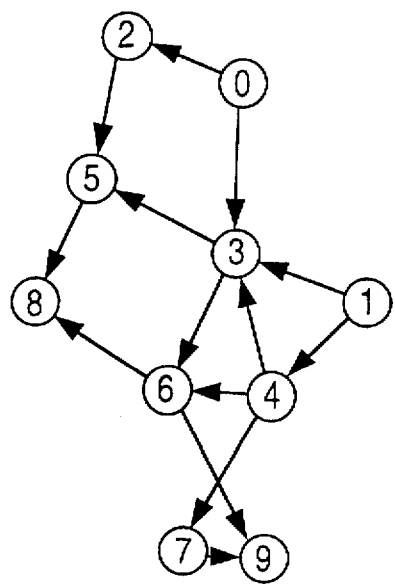
FIGS. 16A, 16B and 16C show layout examples of arrow graphs obtained while using a parallel magnetic field.
Figure 16B:
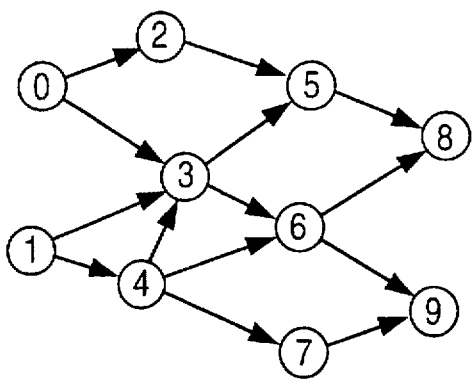
Figure 16C:
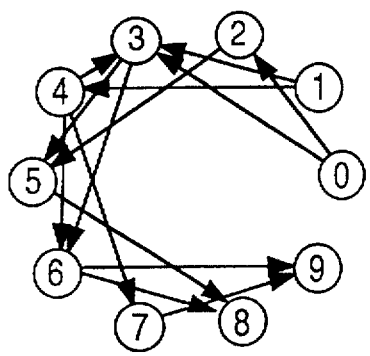
Figure 20A:
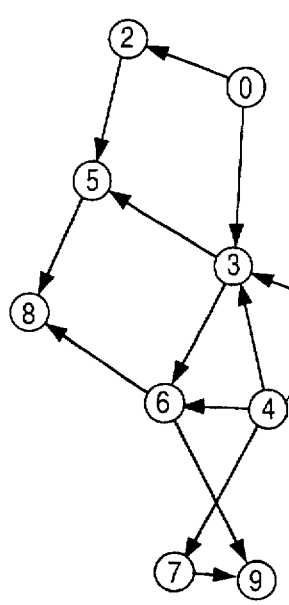
FIGS. 20(A)–(F) are diagrams (1) showing automatic graph layout processing starting from a result shown in FIG. 16A and ending with the result shown in FIG. 16B.
Figure 20B:
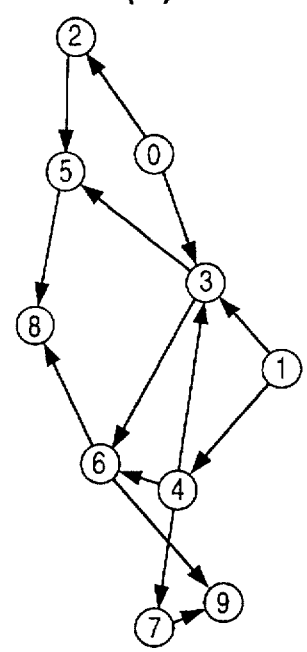
Figure 20C:
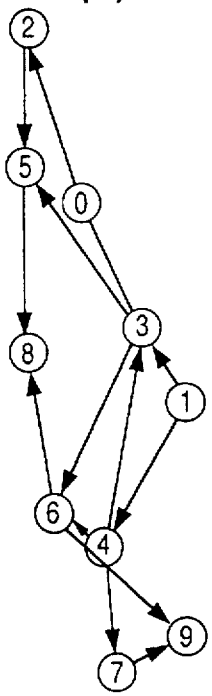
Figure 20D:
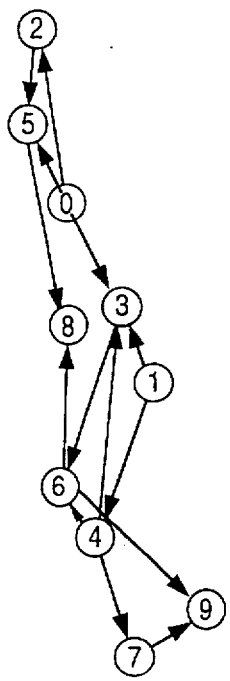
Figure 20E:
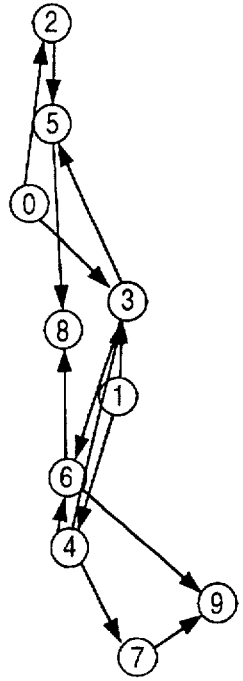
Figure 20F:
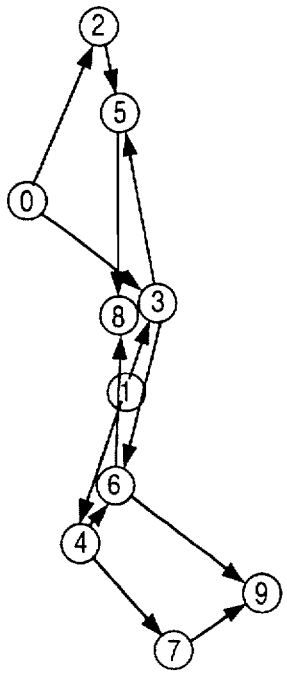
Figure 21C:
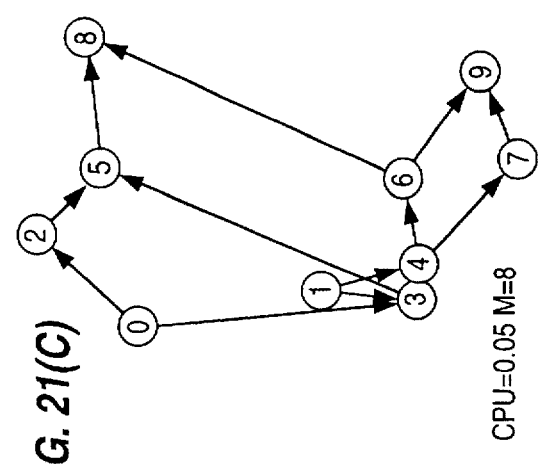
FIGS. 21(A)–(F) are diagrams (2) showing automatic graph layout processing starting from the result shown in FIG. 16A and ending with the result shown in FIG. 16B.
Figure 21F:
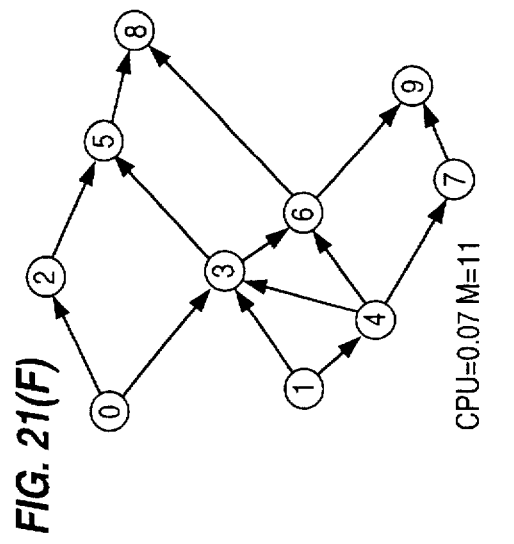
Figure 21B:
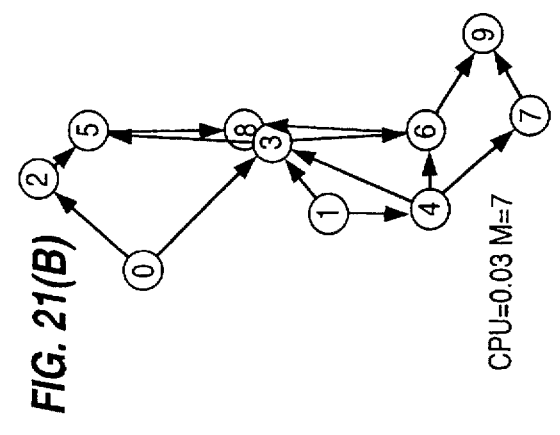
Figure 21E:
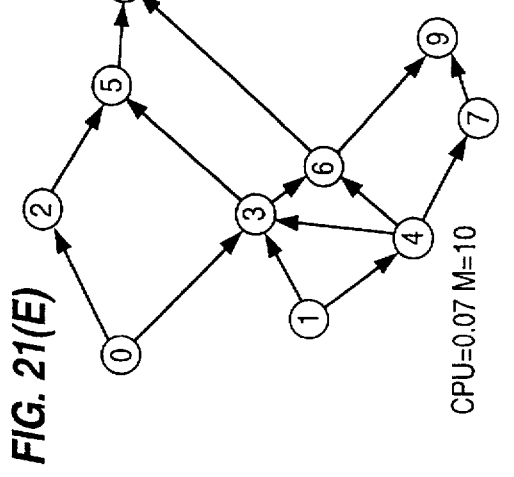
Figure 21A:
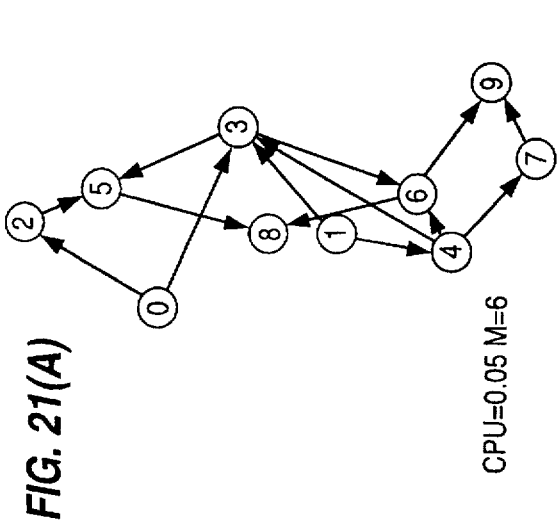
Figure 21D:
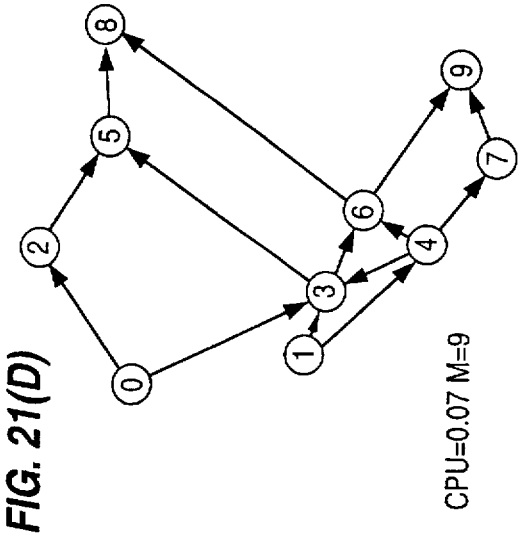

Providing that the direction is denoted by $\beta$ in a case where the force receiving node is a tail, as shown in FIG. 16C, t is represented by the following equation.

$$t = \beta - (\phi + \pi) \pm 2 n\pi \quad (7)$$

In any case, however, n should be in the order: n=0, 1, . . . , so as to enable t to take a normalized value of $-\pi < t \leq \pi$. In the equation (5), $P_m$ controls the influence which t (the magnitude of the angle by which the magnetic needle is shifted from the direction of magnetic field) adds to the rotation. In other words, the larger the value of $P_m$ is, the larger the value for increasing the rotary power in the larger shift is. d is the length of the current edge. The value of $q_m$ controls the influence on the rotary power for the edge (or a magnetic needle) length. In other words, the longer edge tends to be arranged in the magnetic field direction with stronger power when the value of $q_m$ is larger. b represents the strength of the magnetic field at the reference point and $c_m$ denotes a constant to control the balance with other forces.

It is assumed that the direction of force is shifted by $\pi/2$ anticlockwise from a direction in which the node at the other end of the edge is viewed, because rotation acts clockwise when t>0, and that the direction of force is shifted by $\pi/2$ clockwise from the direction in which the node at the other end of the edge is viewed, because rotation acts anticlockwise when t<0.

The flow chart in FIG. 11 will now be described, wherein the forces as described above act on each node. When the process is started in FIG. 11, force $f_i$ acting on the node i is set to "0" at a step S40, the ordinal number j of the other nodes except the node i is set to "0" at a step S41, and it is confirmed at a step S42 whether or not j is smaller than N.

When j is smaller than N, it is confirmed at a step S43 whether or not i is equal to j. When they are not equal to each other, it is confirmed at a step S44 whether or not the node having the ordinal number i is arranged adjacent to the node having the ordinal number j. When they are arranged adjacent to each other, the force $f_s$ created by the spring and the rotation force $f_m$ created by the magnetic field are calculated at a step S45, and their sum is made to be f at a step S46.

When it is confirmed that they are not arranged adjacent to each other, repulsion or repulsion force $f_r$ which acts between them is calculated at a step S47 and the value thus calculated is made f at a step S48.

The value of f calculated either at the step S46 or S48 is added to the current value of $f_i$ representing the force acting on the i-th numbered node at the step S49, the new value of $f_i$ representing the force acting on the i-th numbered node is calculated, the number of j representing the node number for the other node is incremented at the step S50, and the procedure after S42 is repeated. The procedure after S42 is repeated when it is determined that the value of i is equal to the value of j at S43, because there is no necessity for calculating the force. When it is confirmed at the step S43 that i and j are equal to each other, the step S42 and those following it are repeated because the calculation of force is not needed. When it is confirmed at the step S42 that j is not smaller than N, the process is finished.

Figure 13:
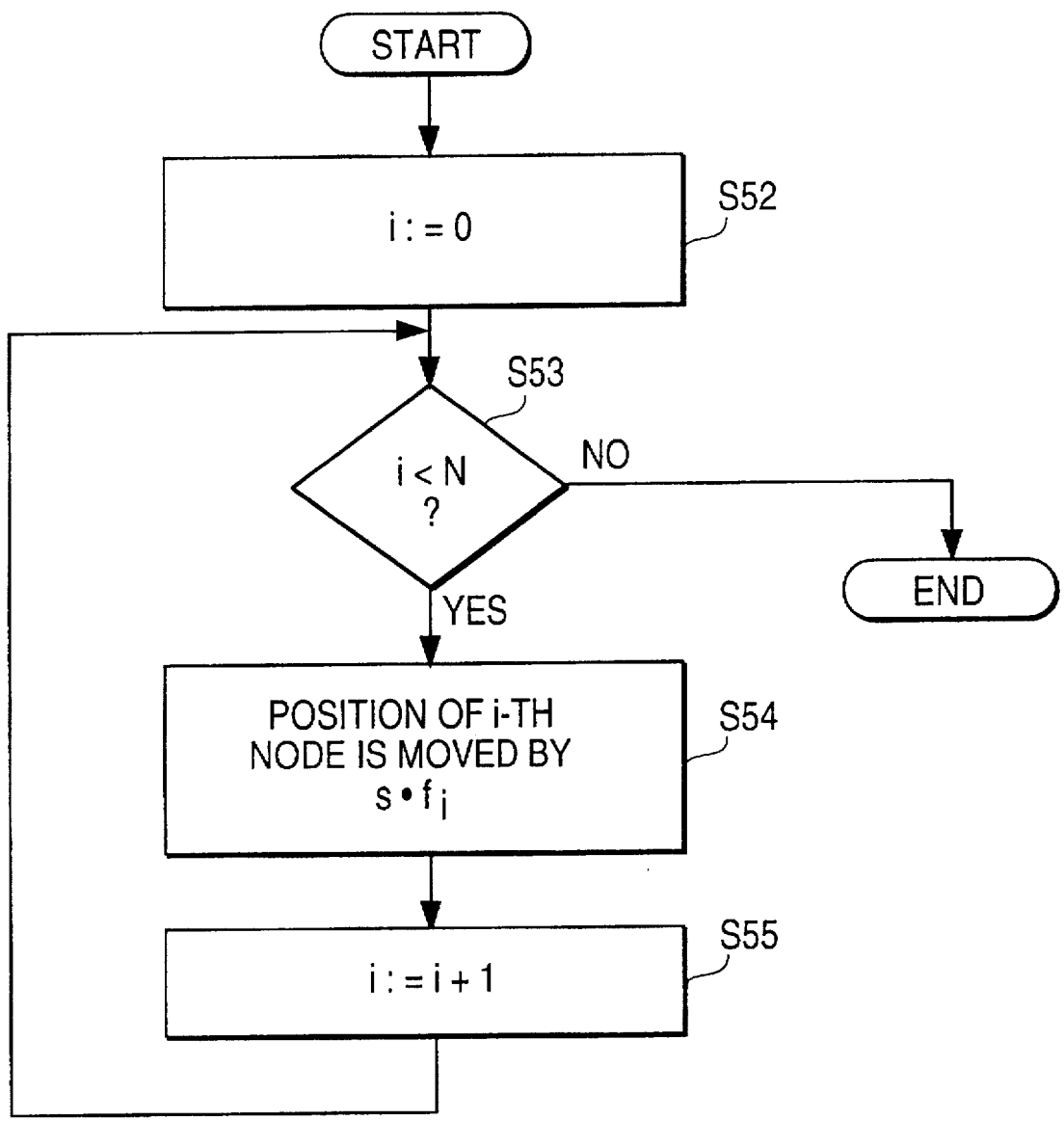
FIG. 13 is a detailed flow chart showing steps of correcting the position of each node.

FIG. 13 is a flow chart showing the step S24 in FIG. 8 or the node position correcting process in more detail. When the process is started in FIG. 13, the value of i which denotes the node ordinal number is set to "0" at a step S52, and it is confirmed whether or not the value of i is smaller than N at a step S53. When i is smaller than N, the position of the i-th node is moved to become more stable at a step S54.

This amount of movement is s times the force $f_i$ which acts on the i-th node, and which was obtained in FIG. 11. The value of s is small, for example, 0.1. When the value of s is made smaller as the repeating steps progress, a more stable state can be obtained as seen, for example, in the case of simulated annealing.

An increment is then added, at a step S55, to the value of i which denotes the ordinal number of the node, and the step S53 and those following it are repeated. When it is confirmed at the step S53 that i is not smaller than N, the process is finished.

Figure 14:
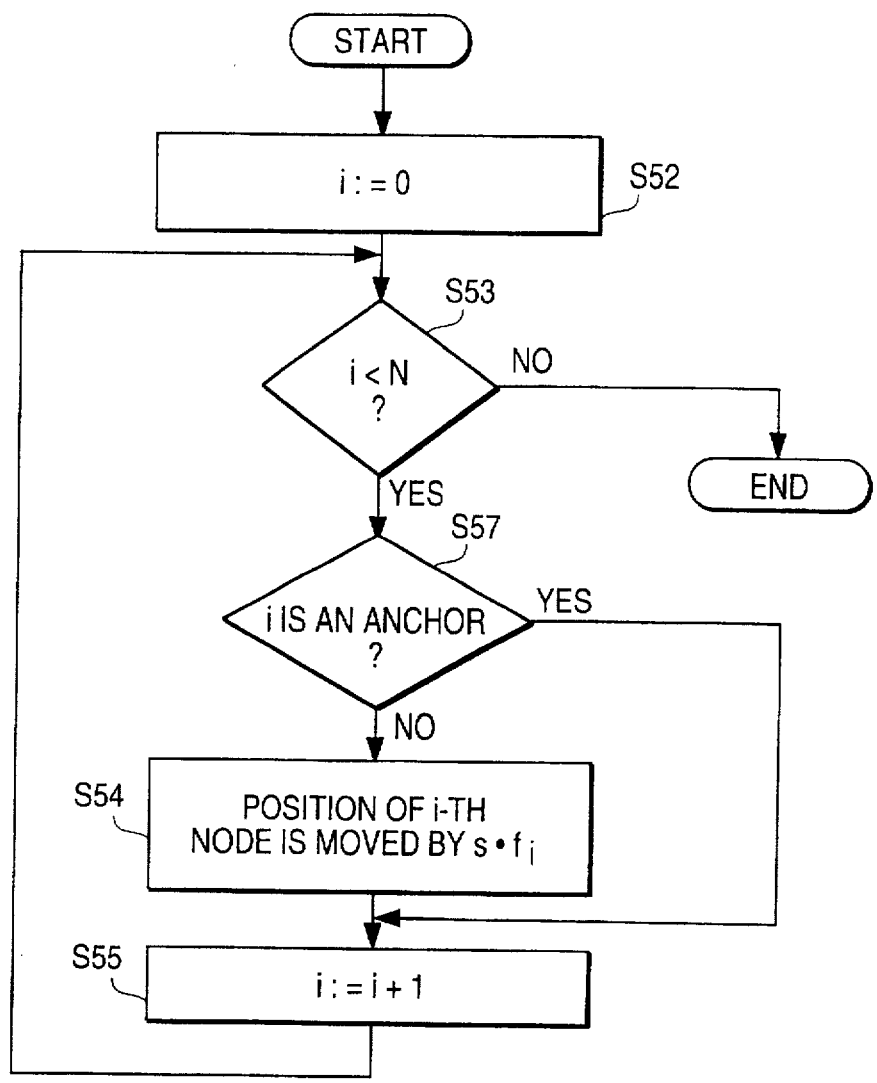
FIG. 14 is a flow chart showing steps of correcting the position of each node according to another embodiment of the present invention.

FIG. 14 is a flow chart showing a node position correcting process in detail according to a further embodiment of this invention, the correcting process being carried out in the case of an automatic graph layout method in which the stable state of a physical model is attained while keeping some of the graph-constituting nodes fixed in position. As compared with the flow chart in FIG. 13, the flow chart in FIG. 14 is different in the following point: it is confirmed at the step S53 that the node ordinal number i is smaller than N, and it is then confirmed at a step S57 whether or not the node is fixed, that is, whether or not it is appointed as an anchor; when it is not an anchor, the node position is moved at the step S54 and when it is an anchor, the process advances to the step S55 without moving the node position.

Figure 15:
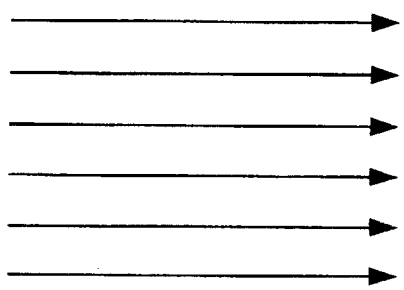
FIG. 15 shows a parallel magnetic field.

An example of a magnetic field used by the present invention will now be described. FIG. 15 shows a parallel magnetic field whose direction is identical at any position on a plane. This magnetic field can be expressed by the following equation, wherein the magnitude of the magnetic field at a coordinate position (x, y) is b(x, y).

$$B(x, y) = b(x, y) \cdot u \quad (8)$$

wherein u is a unit vector which represents the direction of the magnetic field, and b(x, y) denotes the strength of the magnetic field at (x, y).

Examples of graphs laid out by using the parallel magnetic field are shown in FIGS. 16A, 16B and 16C.

In this case, b(x, y)=1, that is, the strength of magnetic field is constant at all times. Edges in the graph laid out using the parallel magnetic field are directed substantially in one direction. This makes it easier to understand the flow of the entire graph.

FIG. 16A shows a result obtained by the automatic graph layout which is conducted while correcting positions of nodes in their initial arrangement shown in FIG. 16C, but without applying any magnetic field to them. FIG. 16B shows a result obtained while also applying the parallel magnetic field to them. All of the edges in FIG. 16B are directed in the direction of the parallel magnetic field shown in FIG. 15. In short, they are directed to the right.

FIGS. 17(A)–(F) through 19(A)–(F) show how the graph layout progresses, starting from the above-mentioned initial arrangement and ending with the layout result shown in FIG. 16B. M denotes the repeat count number for which the correction of node positions is repeated, and CPU denotes the time during which the automatic graph layout is processed.

FIGS. 17(A)–(F) show a process starting from the initial arrangement, in which M=0, and ending with the fifth repeated step, FIGS. 18(A)–(F) show a process starting from the sixth and ending with the eleventh repeated step, and FIGS. 19(A)–(F) show a process starting from the twelfth and ending with the seventeenth repeated step. The result obtained by the seventeenth repeated step is substantially the same as that shown in FIG. 16B.

According to the present invention, the result shown in FIG. 16B and obtained by the automatic graph layout with the parallel magnetic field can be calculated from those shown in FIG. 16A and obtained by the layout without using a magnetic field. FIGS. 20(A)–(F) and 21(A)–(F) show a process of this case.

In FIGS. 20(A)–(F), the process is started on the basis of the result shown in FIG. 16A, and obtained in a case where M=100 and CPU=0.62. CMF represents a constant $c_m$ to control the balance of rotational force with the other forces in the above-mentioned magnetic field. FIG. 16A shows that the node position correction is repeated 100 times with CMF=0.00.

FIG. 20(A)–(F) show results obtained by repeating the correction of node positions five times after starting from FIG. 16A, and FIGS. 21(A)–(F) show results obtained by repeating the correction of node positions from six times to eleven times. The final result shown in FIGS. 19(A)–(F) is substantially similar to that shown in FIG. 16B.

FIGS. 22(A)–(F) show processing obtained by conducting the automatic graph layout while keeping parts 0 and 3 of the nodes fixed in position as described in FIG. 14. Also in FIGS. 22(A)–(F), the processing corresponds to the number of times for which the correction of node positions is repeated to obtain a result similar to that shown in FIG. 16B, after starting from the result shown in FIG. 16A. FIGS. 22(A)–(F) show that a result similar to that shown in FIG. 16B can be obtained by repeating the correction of node positions 100 times, while keeping the positions of the nodes 0 and 3 fixed after starting from the result shown in FIG. 16A.

Figure 23B:
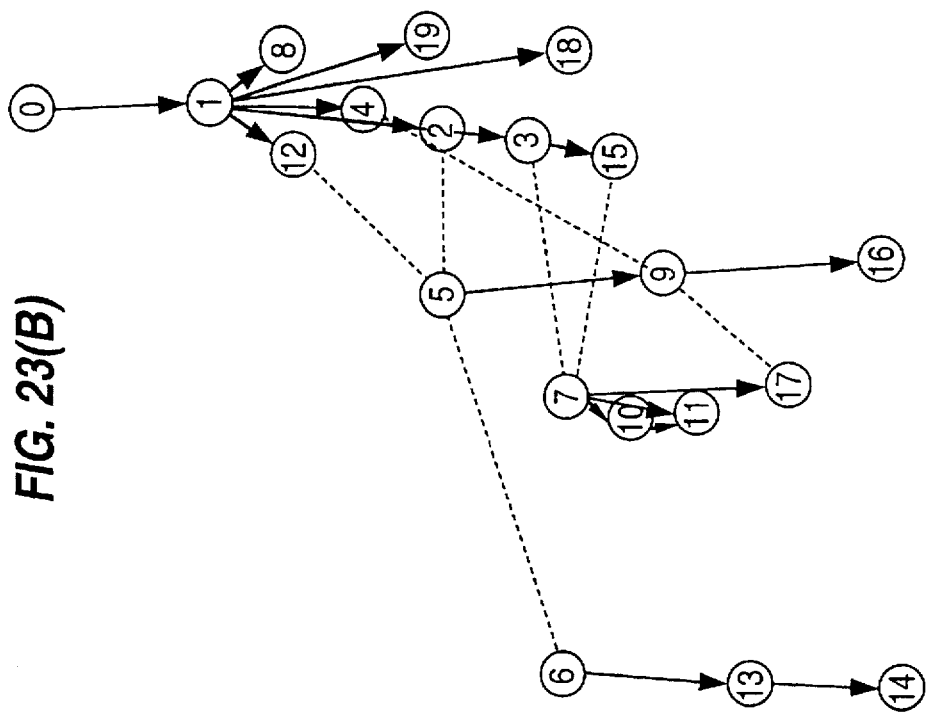
FIGS. 23A and 23B are diagrams showing layout examples of mixed graphs obtained while using a parallel magnetic field.
Figure 23A:
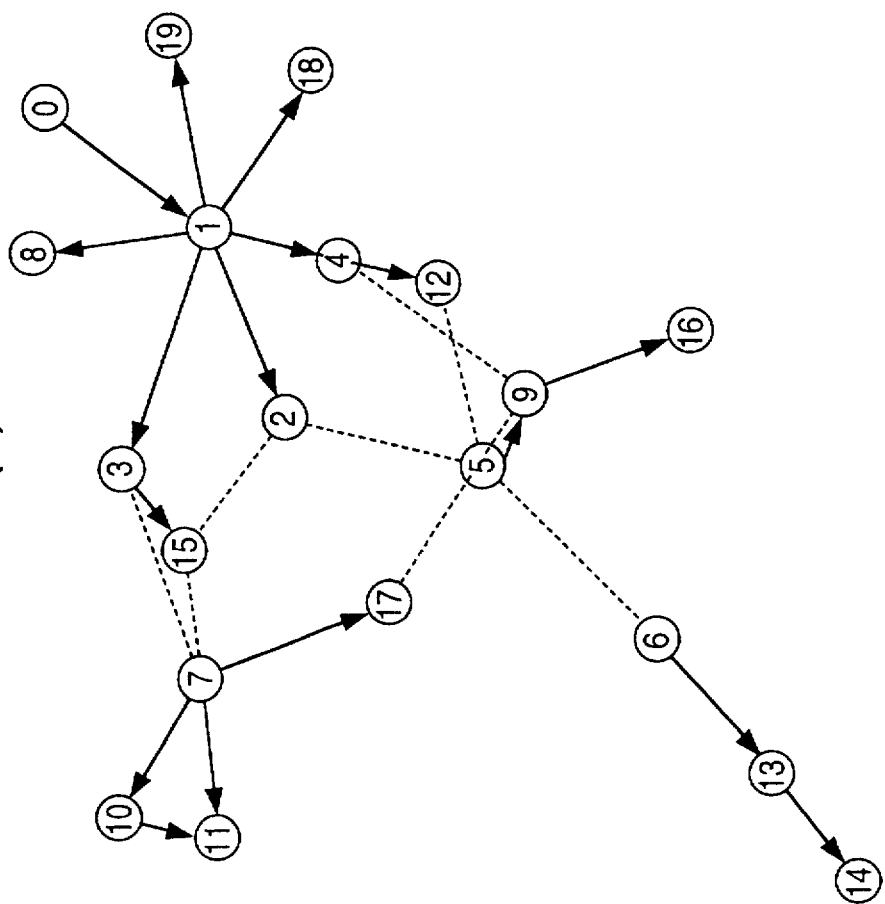

FIGS. 23A and 23B show automatic graph layouts whose targets are a mixed graph in which arrow and non-arrow edges are present.

FIG. 23A shows a result obtained by the automatic graph layout which is conducted by repeating the correction of node positions in an initial arrangement (not shown) without applying a magnetic field to the nodes. FIG. 23B shows a result obtained while applying a downward parallel magnetic field to the nodes. It is understood from FIG. 23B that arrow edges are directed downward in the same direction although non-arrow edges are directed in various directions.

FIGS. 24(A)–(F) shows processing starting from the result shown in FIG. 23A and ending with the result shown in FIG. 23B.

Figure 25:
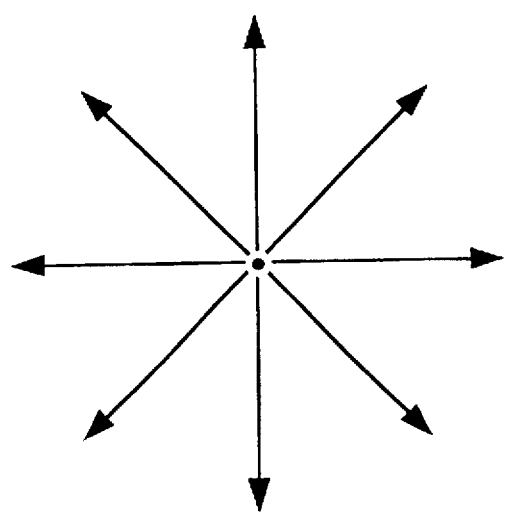
FIG. 25 shows a radial magnetic field.

FIG. 25 shows that a result similar to that shown in FIG. 23B can be obtained by repeating the correction of node positions 100 times after starting from the result shown in FIG. 23A, which is obtained by repeating the correction of node positions 800 times while keeping CMF "0".

Another example of a magnetic field is the radial type. It is assumed that a magnetic field spreading outward or inward radially from a center point, as shown in FIG. 25, is called radial magnetic field. An outward-spreading radial magnetic field can be expressed as follows.

$$B(x, y) = b(x, y) \cdot \frac{(x - x_0, y - y_0)}{|(x - x_0, y - y_0)|} \quad (9)$$

wherein a point $C(x_0, y_0)$ is the center of the radial magnetic field and $b(x, y)$ represents a strength of the magnetic field at a point $(x, y)$.

Figure 26B:
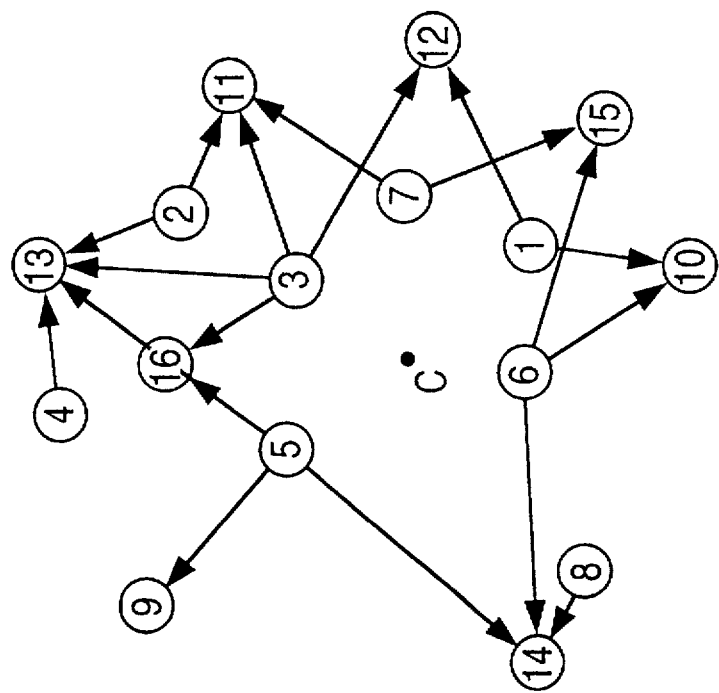
FIGS. 26A and 26B are diagrams showing layout examples of graphs obtained while using a radial magnetic field.
Figure 26A:
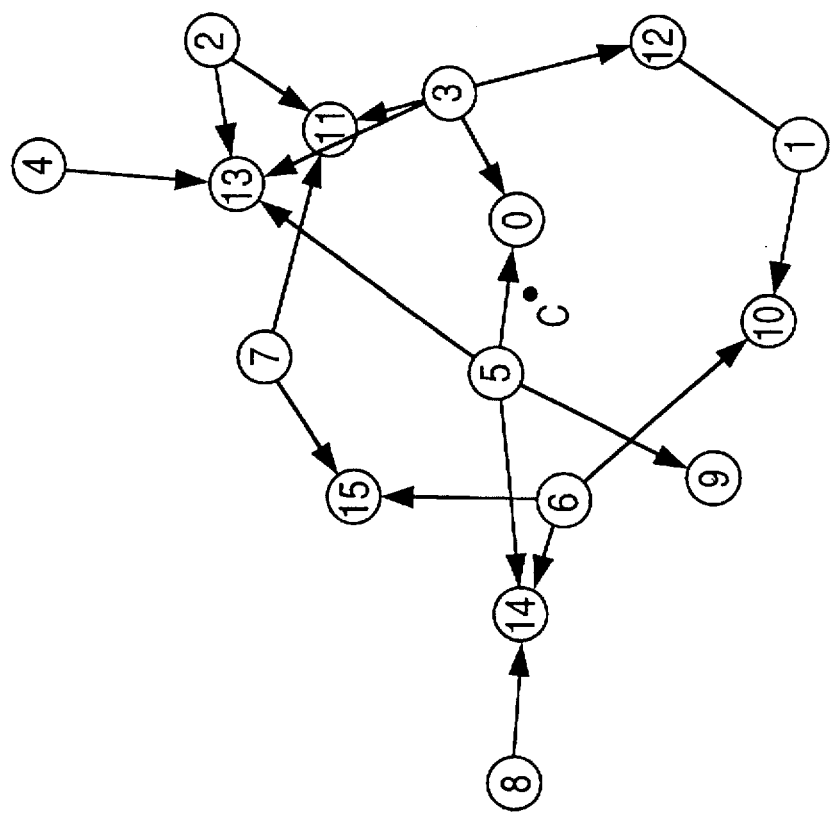

Examples of the graph laid out while using a radial magnetic field are shown in FIGS. 26A and 26B. The strength of magnetic field is expressed in this case by $b(x, y)=1$, and it is therefore constant at any point, except at the center point $C(x_0, y_0)$.

Figure 27:
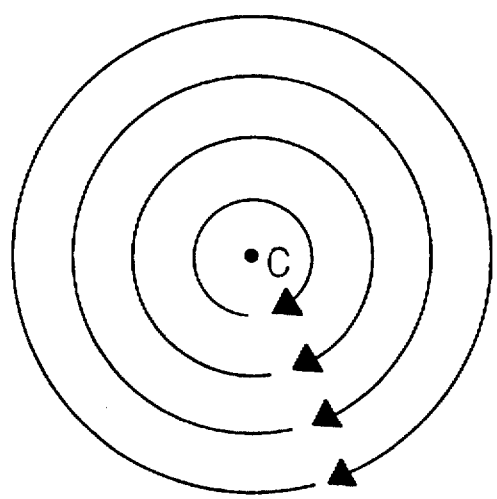
FIG. 27 shows a concentric magnetic field.

It is assumed that a magnetic field spreading concentrically in a clockwise or anticlockwise direction around a center point, as shown in FIG. 27, is called a concentric magnetic field. The clockwise spreading concentric magnetic field can be expressed as follows.

$$B(x, y) = b(x, y) \cdot \frac{(y - y_0, -x + x_0)}{|(y - y_0, -x + x_0)|} \quad (10)$$

In this case, a point $C(x_0, y_0)$ is the center of the concentric magnetic field, and $b(x, y)$ denotes a strength of the magnetic field at a point $(x, y)$.

Figure 28A:
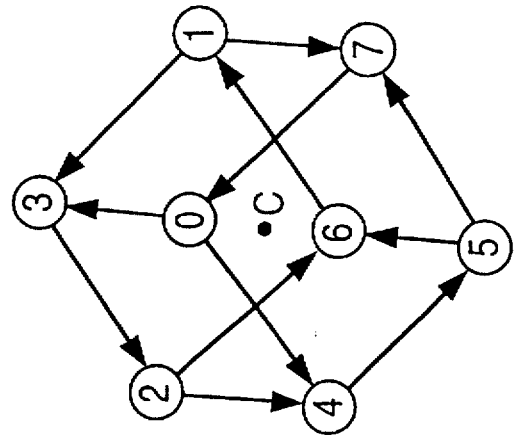
FIGS. 28A and 28B are diagrams showing layout examples of graphs obtained while using a concentric magnetic field.
Figure 28B:
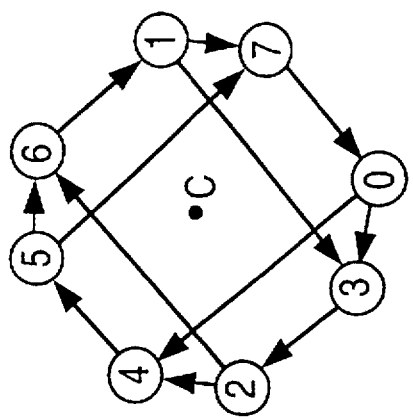

FIGS. 28A and 28B show examples of the graph laid out while using a concentric magnetic field. The strength of the magnetic field in this case is expressed by $b(x, y)=1$, and it is therefore constant at any point of the field, except at the center point $C(x_0, y_0)$ thereof. When a graph having a circular structure (or cycle) is laid out while using a concentric magnetic field, it becomes easier to visualize the circular structure. It cannot be readily understood where the cycle is present in the result shown in FIG. 28A, laid out without a magnetic field, but the state of the cycle can be made more noticeable by the result laid out with a concentric magnetic field, as shown in FIG. 28B.

The above-mentioned magnetic fields used by the present invention are not present in the natural world, and are virtual. Their quality can be therefore freely and randomly changed. In short, two or more of the above-mentioned parallel, radial and concentric magnetic fields can be combined without any influence between them, and used as a combined or composite magnetic field. One of these examples is an orthogonal parallel magnetic field.

Figure 29:
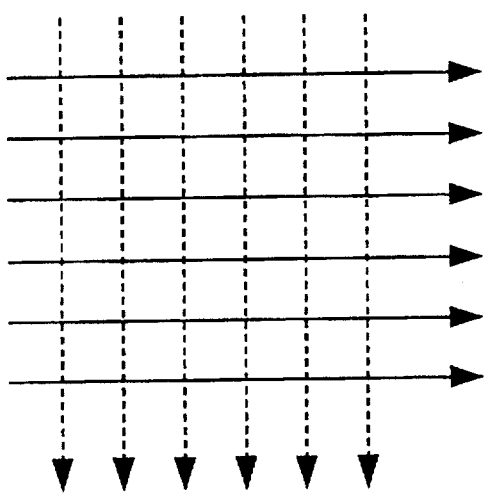
FIG. 29 shows an orthogonal parallel magnetic field.

A composite magnetic field consisting of two parallel magnetic fields which cross at right angles is called an orthogonal parallel magnetic field (see FIG. 29). This magnetic field can be expressed as follows.

$$B_1(x,y)=b_1(x, y) \cdot u_1$$

$$B_2(x, y)=b_2(x, y) \cdot u_2 \quad (11)$$

wherein $u_1$, and $u_2$ are unit vectors crossing each other at right angles, $b_1(x, y)$ denotes a strength of the first magnetic field at a point $(x, y)$, and $b_2(x, y)$ represents a strength of the second magnetic field at the point $(x, y)$.

Figure 30B:
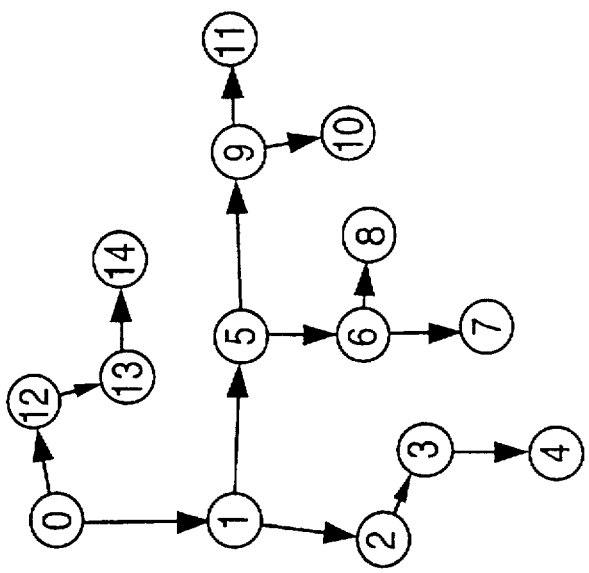
FIGS. 30A and 30B are diagrams showing layout examples of graphs obtained while using an orthogonal parallel magnetic field.
Figure 30A:
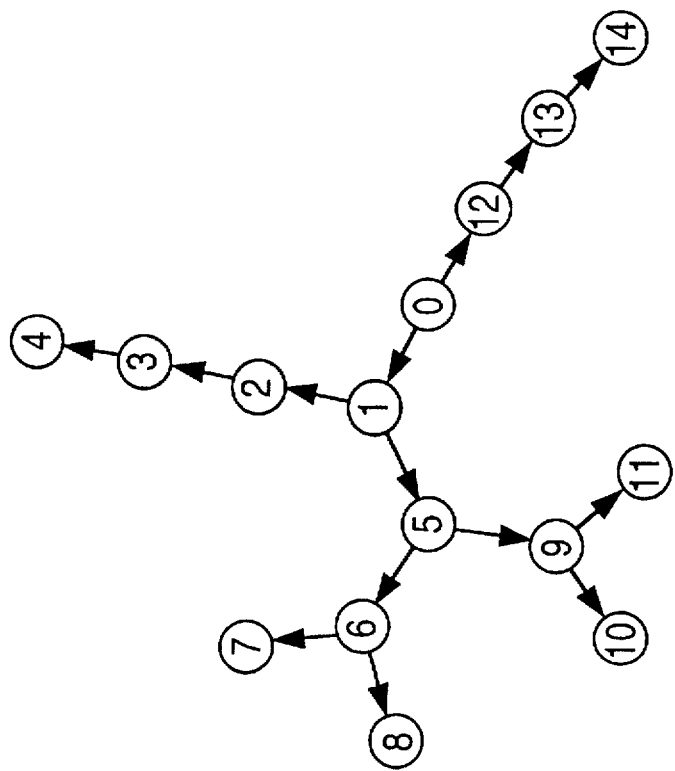

Examples of graphs laid out using the orthogonal parallel magnetic field are shown in FIGS. 30A and 30B. The strength of magnetic field in this case is made $b_1(x, y)=b_2(x, y)=1$, and it is therefore constant throughout the magnetic field. In the graph laid out using the orthogonal parallel magnetic field, it becomes easier to grasp the two kinds of flow in the structure of the graph. In the case of results obtained by laying out without a magnetic field, the structures of two-branched trees are apparent, but the edges are randomly directed, as shown in FIG. 30A. In FIG. 30B, however, all edges are arranged directly to the right or downward.

A dynamic magnetic field can be conceived as a further example of a magnetic field. In radial and concentric magnetic fields, for example, a point defining the magnetic field, that is, the center of a circle, for example, can be made to be dynamic instead of being fixed. When the co-ordinates of a specific node are used as a point for defining a magnetic field, the magnetic field can be changed as the graph is manipulated, thereby enabling an arrangement having a specific node as its center in the radial magnetic field, for example, to be achieved more easily.

Control of the directions of non-arrow edges will now be described. It is desired in many cases that arrow edges are laid out while keeping them pointing in the same direction. In non-arrow edges having no means of indicating pointing in a direction, it is meaningless to say that they should point in a direction, but it is sometimes desirable that they are laid out oriented in the same direction. (The term pointing is used as being different to "direction": "pointing" is used to indicate pointing south or "pointing north", but using "direction", as in a south direction or a north direction, makes it irrelevant whether they point to the south or to the north. In order to orientate these non-arrow edges in a direction, the property of the magnetic springs is corrected in such a way that rotational forces act on them so that one or the other end points to the nearest one of poles S and N.

For example, in order for the node nearest to the magnetic field direction at the middle point of the edge to be directed in the magnetic field direction (the node farthest from the magnetic field direction at the middle point of the edge is directed opposite to the magnetic field direction) the following expression (12) can be used for calculating the value of t instead of using the expressions (6) and (7). Wherein an angle at which a node for calculation of the force acting on it is viewed from the side of the other node, is denoted by τ.

$$t=\tau-\phi\pm n\pi \quad (12)$$

wherein n=0, 1, - - - to enable t to take a value of $-\pi/2 < t \leq \pi/2$.

Figure 31:
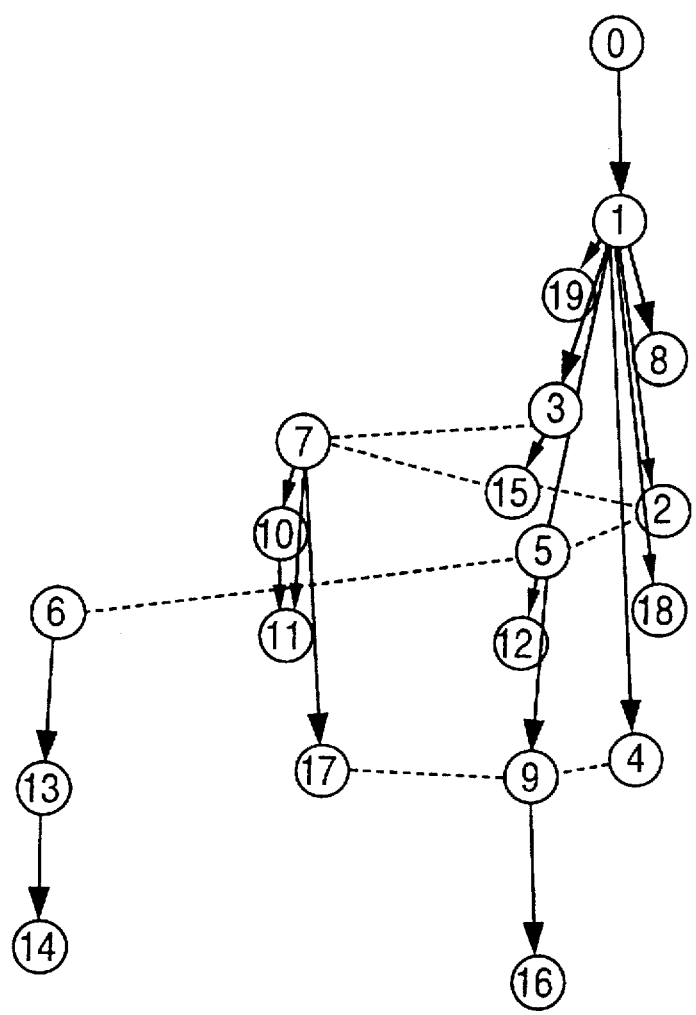
FIG. 31 is a diagram showing a layout example of a mixed graph obtained while using an orthogonal parallel magnetic field.

FIG. 31 shows a result obtained by laying out while applying the orthogonal parallel magnetic field shown in FIG. 29 to the mixed graph shown in FIGS. 23(A) and (B), and arrow edges are directed downward in the vertical direction while non-arrow edges are directed in the horizontal direction.

Figure 1:
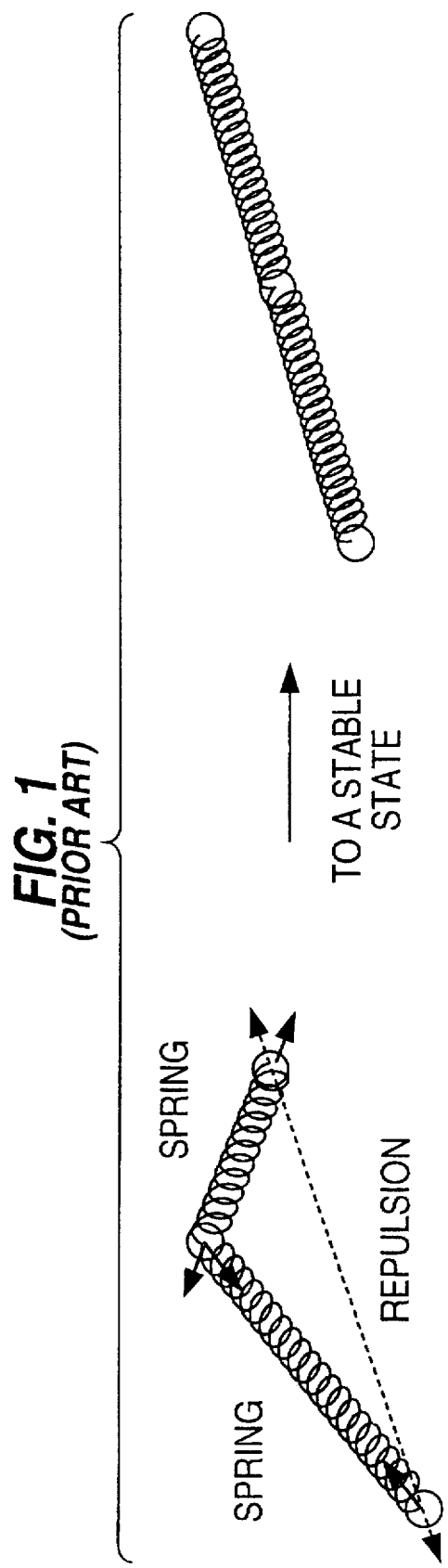
FIG. 1 is an explanatory diagram showing the layout of a graph obtained corresponding to a model in which springs are used according to the conventional force directive method.
Figure 2:
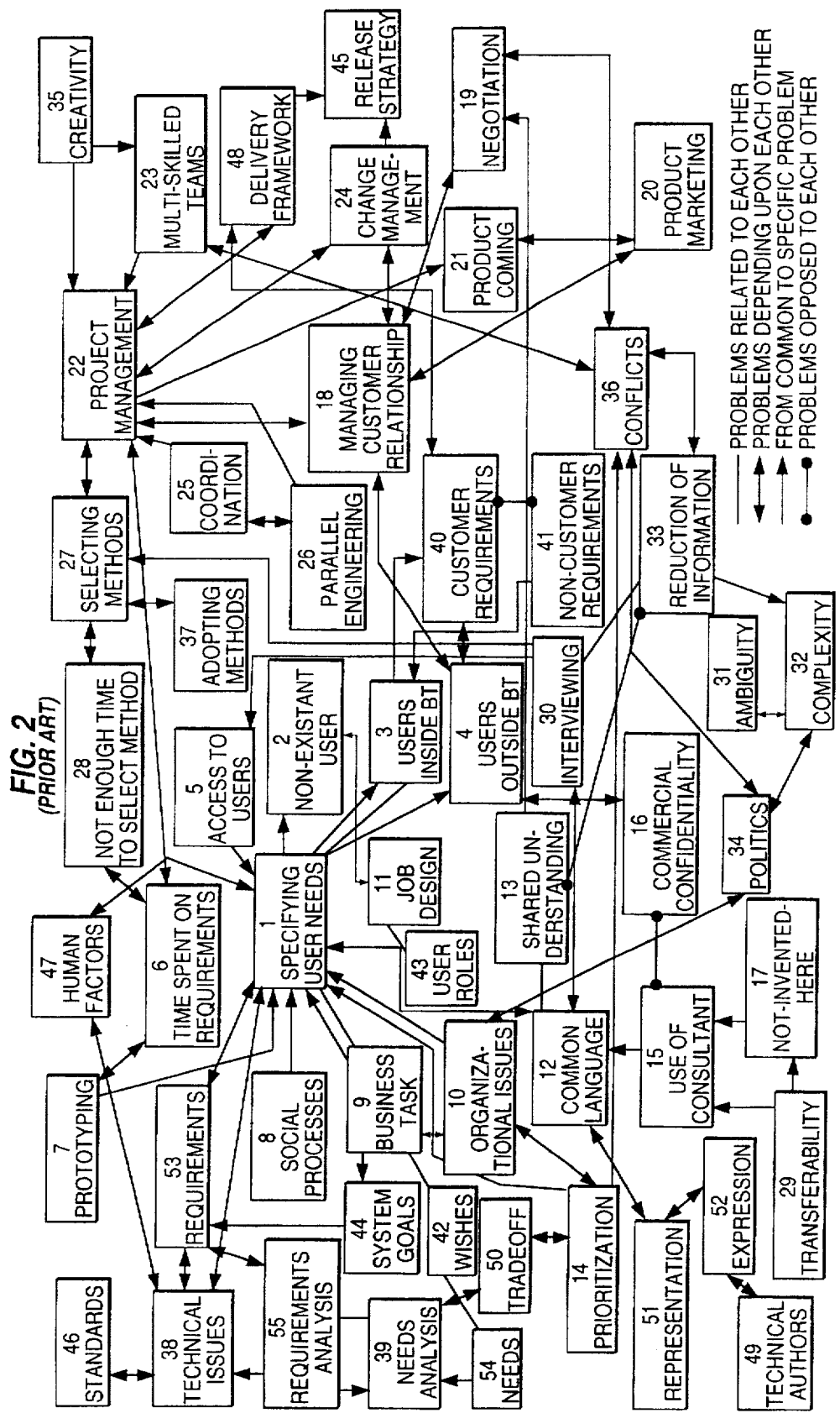
FIG. 2 shows a problem map as an example of a mixed graph.
Figure 3:
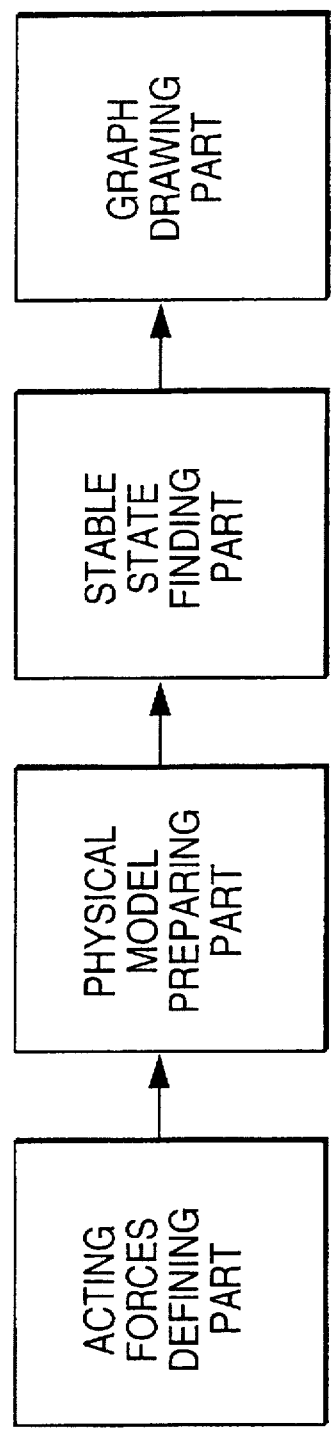
FIG. 3 is a block diagram showing the present invention.
Figure 32B:
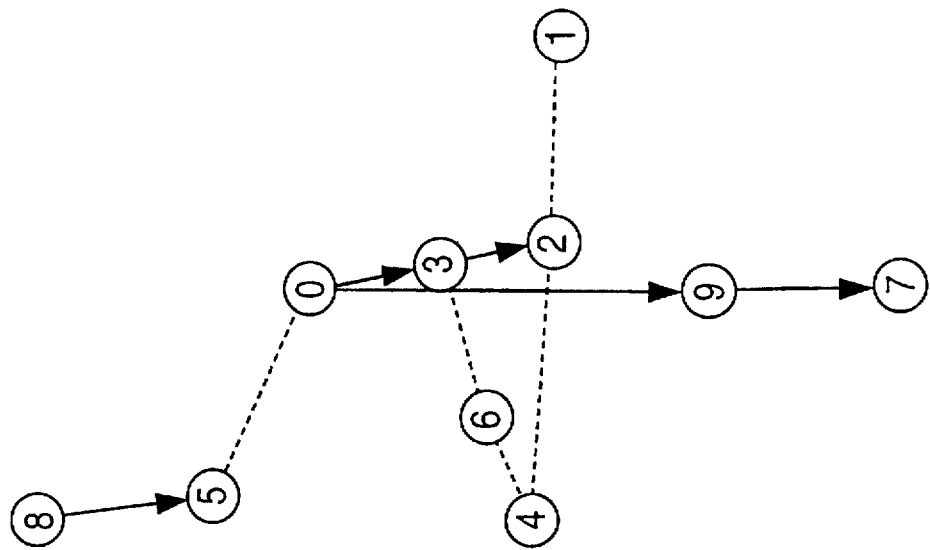
FIGS. 32A and 32B are diagrams showing automatic layout examples of comparatively simple problem charts.
Figure 32A:
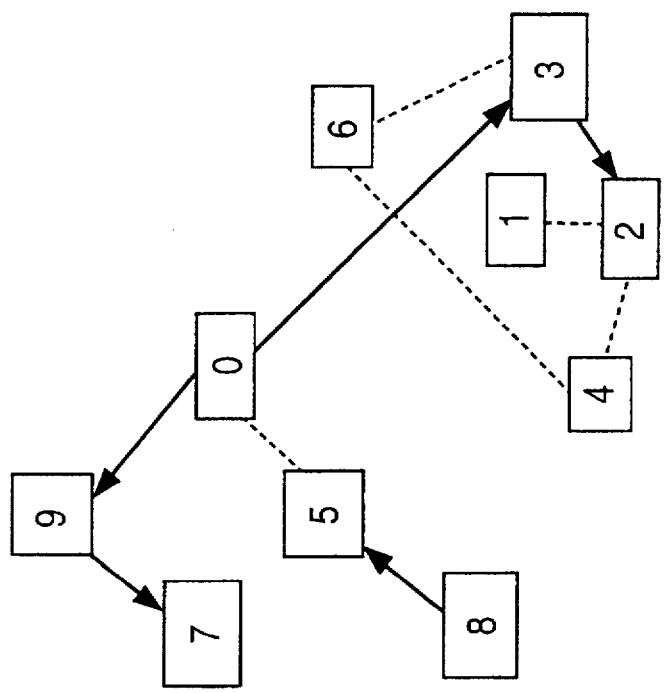

FIGS. 32A and 32B show layout examples of a comparatively simple problem chart similar to a problem chart shown in FIG. 2.

FIG. 32A shows the problem chart laid out by hand, in which solid lines denote arrow edges and broken lines denote non-arrow edges. FIG. 32B shows a result obtained by automatically laying out the same problem chart as in FIG. 32A according to the method of the present invention.

Arrow edges are directed substantially in the vertical direction while non-arrow edges substantially in the horizontal direction, in this case.

Figure 33:
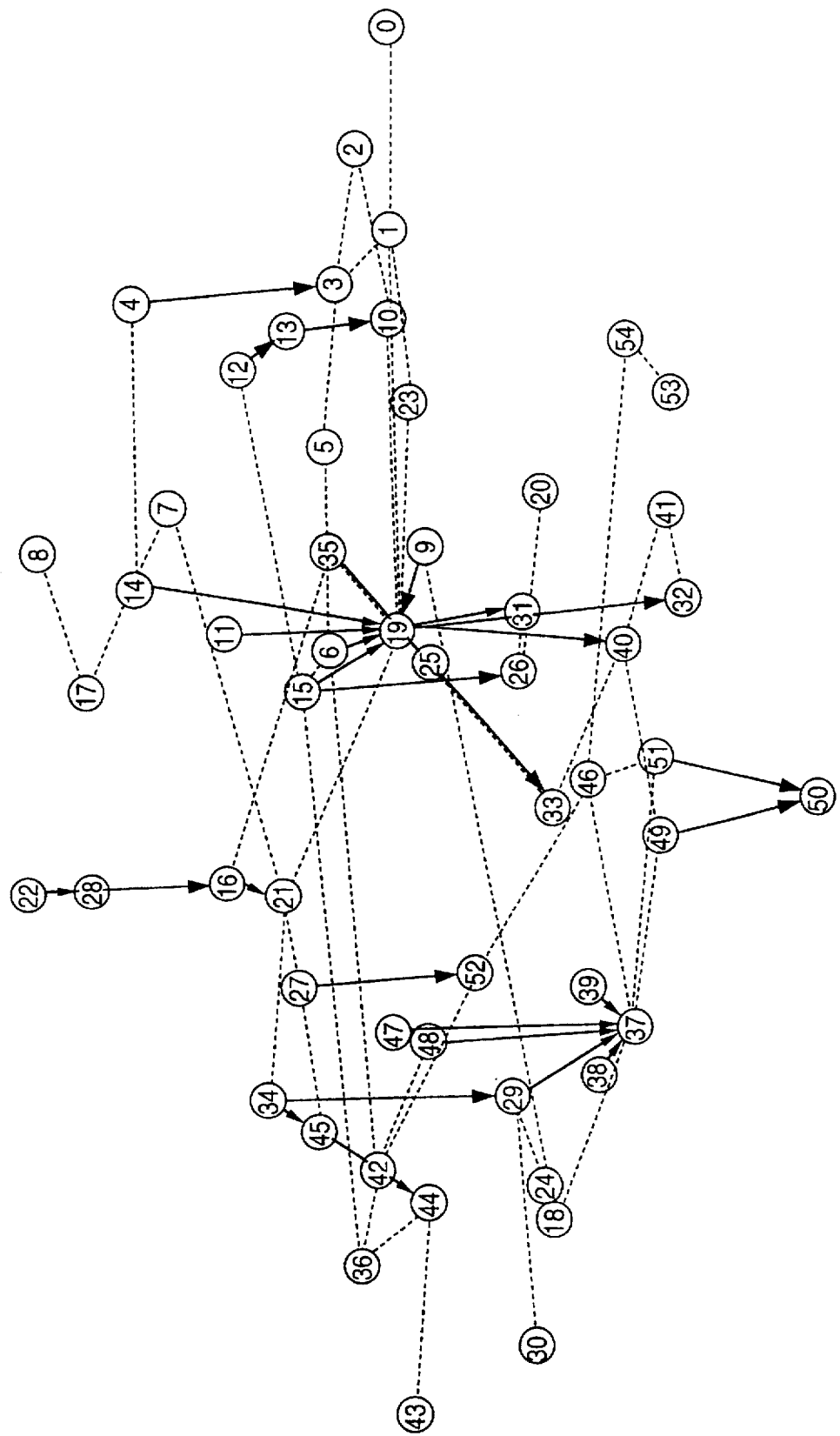
FIG. 33 is a diagram showing a result obtained by automatically laying out the whole of a problem chart.

FIG. 33 shows a result obtained by automatically laying out the whole of the problem chart shown in FIG. 2. The result is obtained by repeating the correction of node positions 1,200 times. In this case, arrow edges are directed substantially in the vertical direction while non-arrow edges are directed substantially in the horizontal direction.

According to the present invention, directions of arrow or non-arrow edges can be controlled, as described above in detail, when a graph is to be automatically laid out. Control can therefore be achieved in such a way that certain kinds of edges are directed in a certain direction, when laying out an arrow graph having a plurality of kinds of edges, and that arrow edges are directed in a certain direction and non-arrow edges are directed in another certain direction, in the layout of a mixed graph. This makes it easier for people to understand graphs in which various structures such as state transitions and data flow maps are expressed.

What is claimed is:

1. An automatic graph layout apparatus for determining a position of each node in a graph, having a plurality of nodes and edges, each of the edges showing a relationship between said plurality of nodes, comprising:

acting forces defining means for defining forces acting on said plural edges to control the direction of each of the edges;

physical model preparing means for preparing a physical model into which said defined forces are incorporated and which corresponds to a graph;

stable state finding means for finding a stable state of the physical model by progressively repeating the correction of position of each node in the physical model; and graph outputting means for outputting a graph corresponding to said stable state of said physical model.

2. The apparatus set forth in claim 1 further comprising:

programs data storing means for storing programs to achieve automatic graph layout; and graph data storing means for storing data to achieve automatic graph layout.

3. The apparatus as set forth in claim 2, wherein said program data storing means comprises:

total management means for managing a whole of automatic graph layout, initial calculation means for calculating an initial arrangement of each node, repeat management means for managing a number of times for which a node position set is corrected while being controlled by said total management means, correction amount calculating means for calculating an amount of positional correction of a node using node data and edge data, and position correction means for correction the position of said node in response to output of said correction amount calculating means, wherein said graph data storing means comprises graph data of node data for node attributes and edge data for edge attributes, and data representing the physical model.

4. An automatic graph layout method, performed using a computer, for determining a position of each node in a graph, having a plurality of nodes and edges, each of the edges showing a relationship between said plurality of nodes, comprising the steps of:

defining forces which act on said plurality of edges to control the direction of each edge;

preparing a physical model into which said defined forces are incorporated corresponding to said graph;

obtaining a stable state of said physical model; and outputting said graph in accordance with said stable state of said physical model.

5. The automatic graph layout method according to claim 4, wherein a force acting on one of the edges is a rotational force applied to both ends of said one of the edges.

6. The automatic graph layout method according to claim 4, wherein said stable state of said physical model is obtained under a condition that some of said plurality of nodes are positioned in a previously-defined range.

7. The automatic graph layout method according to claim 4, wherein said stable state of said physical model is obtained by progressively repeating a correction process for positioning said each node in said physical model.

8. The automatic graph layout method according to claim 4, wherein said physical model is prepared under a condition that said plurality of edges are regarded as virtual azimuth magnetic needles to correspond to said graph, and that said plurality of edges and nodes are placed in a virtual magnetic field.

9. The automatic graph layout method according to claim 8, wherein said plurality of edges are specific azimuth magnetic needles which are directed to either of poles S and N of said virtual magnetic field.

10. The automatic graph layout method according to claim 8, wherein only a part of said plurality of edges are said virtual azimuth magnetic needles or magnetic springs.

11. The automatic graph layout method according to claim 8, wherein said virtual magnetic field is a parallel magnetic field directed in a same direction.

12. The automatic graph layout method according to claim 8, wherein said virtual magnetic field is a radial magnetic field one of spreading radially outward from a single point and spreading radially inward to a single point.

13. The automatic graph layout method according to claim 8, wherein said virtual magnetic field is a concentric magnetic field spreading concentrically in one of a clockwise and a counterclockwise rotation around a single point.

14. The automatic graph layout method according to claim 8, wherein said virtual magnetic field is a composite field combining at least two magnetic fields, and said virtual azimuth magnetic needles and magnetic springs are influenced by at least two of said at least two magnetic fields.

15. The automatic graph layout method according to claim 8, wherein said magnetic field or a composite magnetic field has an influence on said physical model.

16. The automatic graph layout method according to claim 8, wherein said magnetic field or a composite magnetic field is a dynamic magnetic field and seeks said stable state of said physical model corresponding to a dynamic change of said virtual magnetic field.

17. The automatic graph layout method according to claim 8, wherein said virtual magnetic field or a composite magnetic field dynamically changes with time, and said stable state is obtained by progressively repeating a correction process for positioning each node in said physical model in response to a dynamic change of said virtual magnetic field.

18. The automatic graph layout method according to claim 4, wherein said physical model is prepared under a condition that said plurality of edges are regarded as magnetic springs having a quality of virtual azimuth magnetic needles and that said plurality of edges and nodes are placed in a virtual magnetic field.

19. The automatic graph layout method according to claim 18, wherein said plurality of edges are specific azimuth magnetic needles which are directed to either of poles S and N of said virtual magnetic field.

20. The automatic graph layout method according to claim 18, wherein only a part of said plurality of edges are said virtual azimuth magnetic needles or magnetic springs.

21. The automatic graph layout method according to claim 18, wherein said virtual magnetic field is a parallel magnetic field directed in a same direction.

22. The automatic graph layout method according to claim 18, wherein said virtual magnetic field is a radial magnetic field spreading radially outward from a single point or spreading radially inward to a single point.

23. The automatic graph layout method according to claim 18, wherein said virtual magnetic field is a concentric magnetic field spreading concentrically in one of a clockwise and a counterclockwise rotation around a single point.

24. The automatic graph layout method according to claim 18, wherein said virtual magnetic field is a composite field combining two or more magnetic fields, and said virtual azimuth magnetic needles or magnetic springs are influenced by more than one of two or more magnetic fields.

25. The automatic graph layout method according to claim 18, wherein said magnetic field or a composite magnetic field has an influence on said physical model.

26. The automatic graph layout method according to claim 18, wherein said magnetic field or a composite magnetic field is a dynamic magnetic field and seeks said stable state of said physical model corresponding to a dynamic change of said virtual magnetic field.

27. The automatic graph layout method according to claim 18, wherein said virtual magnetic field or a composite magnetic field dynamically changes with time, and said stable state is obtained by progressively repeating a correction process for positioning each node in said physical model in response to a dynamic change of said virtual magnetic field.

28. The automatic graph layout method according to claim 4, wherein said force acting on each edge is gravity.

29. The automatic graph layout method according to claim 4, wherein said force acting on each edge is caused by an electric field.

30. An automatic graph layout apparatus determining a position of each node in a graph, having a plurality of nodes and edges, each of the edges showing a relationship between said plurality of nodes, comprising:

means for storing a virtual physical field having a predetermined directionality;

means for storing a virtual physical element which receives a rotational force according to the directionality if the virtual physical element is placed in the virtual physical field;

means for placing the virtual physical field in a whole of the graph, and representing each of the edges in the graph as the virtual physical element;

means for examining a force relationship occurring in each of the edges in the graph in the virtual physical field, and obtaining the position of a node at which the force relationship becomes stable; and means for outputting the graph based on the position of the node at which the force relationship is stable.

31. An automatic graph layout method performed using a computer and for determining a position of each node in a graph, having a plurality of nodes and edges, each of the edges showing a relationship between said plurality of nodes, comprising the steps of:

placing a virtual physical field having a predetermined directionality in the graph, and handling each of the edges as a virtual physical element which receives a rotational force according to the directionality;

examining a force relationship occurring in each of the edges in the graph in the virtual physical field, and obtaining the position of a node at which the force relationship becomes stable; and outputting the graph based on the position of the node at which the force relationship is stable.

32. A computer-readable storage medium used to direct a computer determining a position of each node in a graph, having a plurality of nodes and edges, each showing a relationship between said plurality of nodes, to perform the functions of:

defining forces which act on said plurality of edges to control the direction of each edge;

preparing a physical model into which said defined forces are incorporated corresponding to said graph;

obtaining a stable state of said physical model; and outputting said graph in accordance with said stable state of said physical model.

33. A computer-readable storage medium used to direct a computer determining a position of each node in a graph, having a plurality of nodes and edges, each showing a relationship between said plurality of nodes, to perform the functions of:

placing a virtual physical field having a predetermined directionality in the graph, and handling each of the edges as a virtual physical element which receives a rotational force according to the directionality;

examining a force relationship occurred in each of the edges in the graph in the virtual physical field, and obtaining the position of a node at which the force relationship becomes stable; and outputting the graph based on the position of the node at which the force relationship is stable.

\* \* \* \* \*